(12) United States Patent
Jeon et al.

(10) Patent No.: US 10,199,507 B2
(45) Date of Patent: Feb. 5, 2019

(54) THIN FILM TRANSISTOR, DISPLAY DEVICE AND METHOD OF MANUFACTURING THE SAME

(71) Applicant: LG Display Co., Ltd., Seoul (KR)

(72) Inventors: Seung Joon Jeon, Gyeonggi-do (KR); Ki Sul Cho, Gyeongbuk (KR); Seong Moh Seo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/011,920

(22) Filed: Aug. 28, 2013

(65) Prior Publication Data

US 2014/0151708 A1 Jun. 5, 2014

(30) Foreign Application Priority Data

Dec. 3, 2012 (KR) .................. 10-2012-0138737
Apr. 29, 2013 (KR) .................. 10-2013-0047635

(51) Int. Cl.
*H01L 29/786* (2006.01)
*H01L 29/66* (2006.01)

(52) U.S. Cl.
CPC .... *H01L 29/7869* (2013.01); *H01L 29/66969* (2013.01); *H01L 29/78633* (2013.01)

(58) Field of Classification Search
CPC .................. H01L 29/78633; H01L 29/78618
USPC .................. 257/91; 438/158; 3/91
See application file for complete search history.

(56) References Cited

U.S. PATENT DOCUMENTS

| | | | |
|---|---|---|---|
| 7,132,687 B2 * | 11/2006 | Kawasaki et al. | 257/59 |
| 2002/0121640 A1 | 9/2002 | Yamazaki | |
| 2005/0045887 A1 * | 3/2005 | Kang | H01L 27/12 257/66 |
| 2005/0100832 A1 * | 5/2005 | Adachi | G03B 27/00 430/395 |
| 2005/0158925 A1 * | 7/2005 | Kim | 438/151 |
| 2008/0299702 A1 * | 12/2008 | Son | H01L 29/7869 438/104 |
| 2009/0087933 A1 * | 4/2009 | Song | 438/30 |
| 2011/0003418 A1 * | 1/2011 | Sakata | H01L 21/02554 438/34 |
| 2011/0068343 A1 * | 3/2011 | Tanabe | 257/66 |
| 2011/0084276 A1 * | 4/2011 | Kang | H01L 29/78609 257/57 |
| 2011/0241005 A1 * | 10/2011 | Ro et al. | 257/59 |
| 2011/0273651 A1 * | 11/2011 | Kim et al. | 349/110 |

(Continued)

OTHER PUBLICATIONS

The 3rd Notification of Office Action dated Mar. 8, 2017 from the Statement Intellectual Property Office of China in counterpart Chinese application No. 201310632892.2. Note: U.S. Pub. 2011/0273651 A1 cited therein is already of record.

*Primary Examiner* — Phuc Dang
(74) *Attorney, Agent, or Firm* — Morgan, Lewis & Bockius, LLP

(57) ABSTRACT

A thin film transistor and a method of manufacturing the same, and a display device and a method of manufacturing the same are disclosed, in which the thin film transistor substrate comprises an active layer formed on a substrate; a gate electrode controlling electron transfer within the active layer; a source electrode connected with one end area of the active layer; a drain electrode connected with the other end area of the active layer; and a light-shielding layer formed under the active layer to shield light from entering the active layer.

21 Claims, 26 Drawing Sheets

(56) References Cited

U.S. PATENT DOCUMENTS

| | | | |
|---|---|---|---|
| 2012/0146038 A1* | 6/2012 | Kitakado | 257/59 |
| 2012/0168761 A1* | 7/2012 | Park et al. | 257/59 |
| 2012/0200546 A1* | 8/2012 | Miyamoto et al. | 345/205 |
| 2012/0249936 A1* | 10/2012 | Zi et al. | 349/106 |
| 2012/0256184 A1* | 10/2012 | Kaneko et al. | 257/59 |
| 2013/0056732 A1* | 3/2013 | Jung et al. | 257/53 |

\* cited by examiner

THIN FILM TRANSISTOR, DISPLAY DEVICE AND METHOD OF MANUFACTURING THE SAME

CROSS REFERENCE TO RELATED APPLICATIONS

This application claims the benefit of the Korean Patent Application No. 10-2012-0138737 filed on Dec. 3, 2012 and the Korean Patent Application No. 10-2013-0047635 filed on Apr. 29, 2013, which are hereby incorporated by reference for all purposes as if fully set forth herein.

BACKGROUND OF THE INVENTION

Field of the Invention

The present invention relates to a thin film transistor, and more particularly, to a thin film transistor used as a switching element of a display device.

Discussion of the Related Art

A thin film transistor has been widely used as a switching device of a display device such as a liquid crystal display device and an organic light emitting device.

The thin film transistor includes a gate electrode, an active layer, a source electrode, and a drain electrode. This thin film transistor may be divided into a staggered structure and a coplanar structure depending on arrangement of the electrodes.

In the staggered structure, the gate electrode and the source/drain electrodes are arranged down and up with reference to the active layer, and in the coplanar structure, the gate electrode and the source/drain electrodes are together arranged on the active layer.

Hereinafter, the thin film transistor according to the related art will be described with reference to the accompanying drawing.

FIG. 1a is a cross-sectional view illustrating a thin film transistor substrate of a coplanar structure according to the related art.

As shown in FIG. 1a, the thin film transistor substrate of the coplanar structure according to the related art includes a substrate 10, a buffer layer 20, an active layer 30, a gate insulating film 40, a gate electrode 50, an insulating interlayer 60, a source electrode 70a, a drain electrode 70b, a passivation film 80, and a pixel electrode 90.

Although glass is mainly used as the substrate 10, a transparent plastic, which may be bent, may be used as the substrate 10.

The buffer layer 20 is formed on the substrate 10, and serves to prevent a material contained on the substrate 10 from being diffused to the active layer 30 during a deposition process of high temperature.

The active layer 30 is formed on the buffer layer 20.

The gate insulating film 40 is formed on the active layer 30 to insulate the gate electrode 50 from the active layer 30.

The gate electrode 50 is formed on the gate insulating film 40.

The insulating interlayer 60 is formed on the entire surface of the substrate including the gate electrode 50. However, since the insulating interlayer 60 includes a first contact hole CH1 in a predetermined area, one end area and the other end area of the active layer 30 are exposed by the first contact hole CH1.

The source electrode 70a and the drain electrode 70b are formed on the insulating interlayer 60. Particularly, the source electrode 70a and the drain electrode 70b are connected with the exposed one end area and the exposed other end area of the active layer 30 through the first contact hole CH1.

The passivation film 80 is formed on the entire surface of the substrate including the source electrode 70a and the drain electrode 70b. However, since the passivation film 80 includes a second contact hole CH2 in a predetermined area, a predetermined area of the drain electrode 70b is exposed by the second contact hole CH2.

The pixel electrode 90 is formed on the passivation film 80. Particularly, the pixel electrode 90 is connected with the exposed predetermined area of the drain electrode 70b through the second contact hole CH2.

However, the aforementioned thin film transistor substrate of the coplanar structure according to the related art has a problem as follows.

The active layer 30 is exposed to light entering from the lower portion of the substrate 10, whereby reliability of the active layer 30 is deteriorated as time passes.

FIG. 1b is a cross-sectional view illustrating a thin film transistor substrate of a staggered structure according to the related art.

As shown in FIG. 1b, the thin film transistor substrate of the staggered structure according to the related art includes a substrate 10, a gate electrode 50, a gate insulating film 40, an active layer 30, a source electrode 70a, a drain electrode 70b, a passivation film 80, and a pixel electrode 90.

The gate electrode 50 is formed on the substrate 10.

The gate insulating film 40 is formed on the gate electrode 50 and insulates the gate electrode 50 from the active layer 30.

The active layer 30 is formed on the gate insulating film 40.

The source electrode 70a and the drain electrode 70b are formed on the active layer 30. In more detail, the source electrode 70a is formed on one end area of the active layer 30, and the drain electrode 70b is formed on the other end area of the active layer 30.

The passivation film 80 is formed on the entire surface of the substrate including the source electrode 70a and the drain electrode 70b. However, since the passivation film 80 is provided with a second contact hole CH2 in a predetermined area, a predetermined area of the drain electrode 70b is exposed by the second contact hole CH2.

The pixel electrode 90 is formed on the passivation film 80. Particularly, the pixel electrode 90 is connected with the predetermined area of the exposed drain electrode 70b through the second contact hole CH2.

However, the thin film transistor substrate of the staggered structure according to the related art has problems as follows.

The gate electrode 50 is formed with a big size to prevent light entering from the lower portion of the substrate 10 from being irradiated to the active layer 30. In this case, as the size of the gate electrode 50 is increased, there may be restriction in designing the thin film transistor. Also, as the size of the gate electrode 50 is increased, parasitic capacitance between the gate electrode 50 and the source electrode 70a and between the gate electrode 50 and the drain electrode 70b may be increased, whereby high speed driving of the device may be deteriorated.

SUMMARY OF THE INVENTION

Accordingly, the present invention is directed to a thin film transistor, a display device, and a method of manufacturing the same, which substantially obviate one or more problems due to limitations and disadvantages of the related art.

An advantage of the present invention is to provide a thin film transistor and a method of manufacturing the same, and a display device and a method of manufacturing the same, in which reliability of an active layer is prevented from being deteriorated due to light entering from a lower portion of a substrate of a coplanar structure and a size of a gate electrode may be reduced in case of a staggered structure.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor substrate comprises an active layer formed on a substrate; a gate electrode controlling electron transfer within the active layer; a source electrode connected with one end area of the active layer; a drain electrode connected with the other end area of the active layer; and a light-shielding layer formed under the active layer to shield light from entering the active layer.

In another aspect of the present invention, a method of manufacturing a thin film transistor substrate comprises forming an active layer on a substrate; forming a gate electrode, which controls electron transfer within the active layer, on the substrate; forming a source electrode connected with one end area of the active layer and a drain electrode connected with the other end area of the active layer; and forming a light-shielding layer under the active layer to shield light from entering the active layer.

In still another aspect of the present invention, a display device comprises a thin film transistor substrate comprising an active layer formed on a substrate; a gate electrode controlling electron transfer within the active layer; a source electrode connected with one end area of the active layer; a drain electrode connected with the other end area of the active layer; and a light-shielding layer formed under the active layer to shield light from entering the active layer.

In further still another aspect of the present invention, a method of manufacturing a display device comprises a method of manufacturing a thin film transistor substrate, the method of manufacturing a thin film transistor substrate comprising forming an active layer on a substrate; forming a gate electrode, which controls electron transfer within the active layer, on the substrate; forming a source electrode connected with one end area of the active layer and a drain electrode connected with the other end area of the active layer; and forming a light-shielding layer under the active layer to shield light from entering the active layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

In this specification, the terminology "on" means that an element is formed directly on another element and a third element is interposed between these elements.

Hereinafter, the preferred embodiment of the present invention will be described in detail with reference to the accompanying drawings.

Figure 1A:
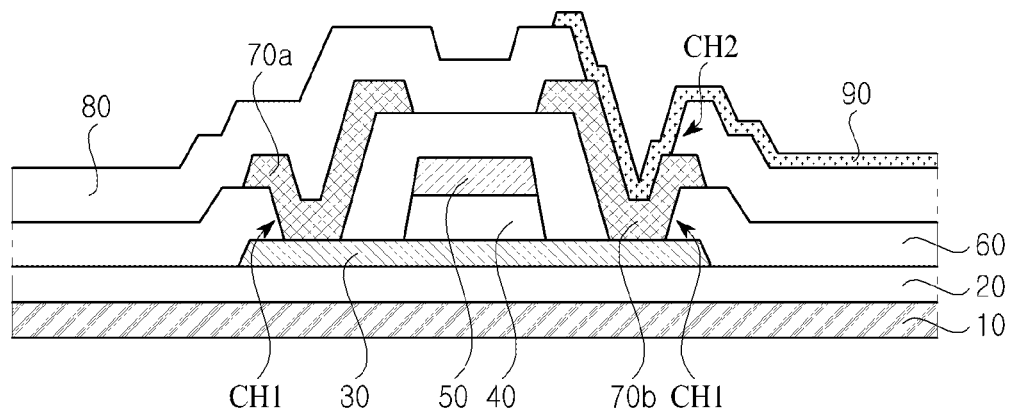
FIG. 1a is a cross-sectional view illustrating a thin film transistor substrate of a coplanar structure according to the related art.
Figure 1B:
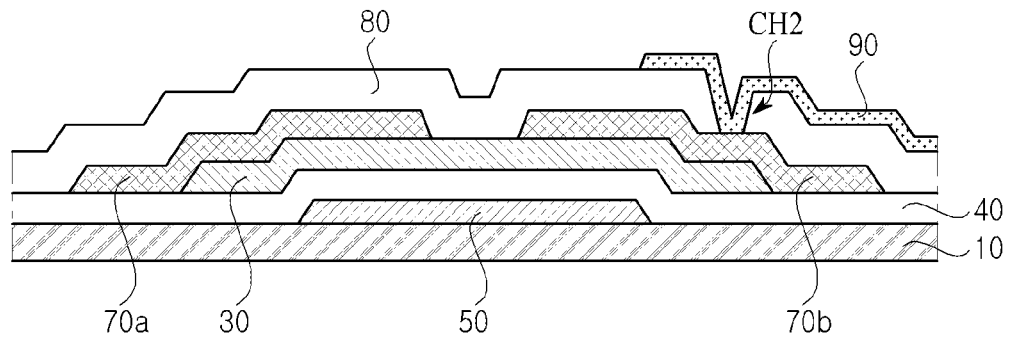
FIG. 1b is a cross-sectional view illustrating a thin film transistor substrate of a staggered structure according to the related art.
Figure 2:
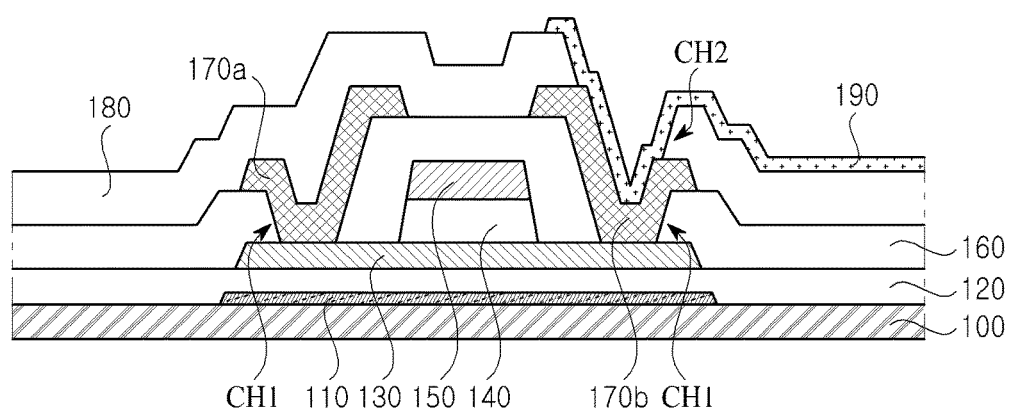
FIG. 2 is a cross-sectional view illustrating a thin film transistor substrate according to one embodiment of the present invention.

FIG. 2 is a cross-sectional view illustrating a thin film transistor substrate according to one embodiment of the present invention.

As shown in FIG. 2, the thin film transistor substrate according to one embodiment of the present invention includes a substrate 100, a light-shielding layer 110, a buffer layer 120, an active layer 130, a gate insulating film 140, a gate electrode 150, an insulating interlayer 160, a source electrode 170a, a drain electrode 170b, a passivation film 180, and a pixel electrode 190.

Although glass is mainly used as the substrate 100, a transparent plastic, which may be bent, for example, polyimide may be used as the substrate 100. If polyimide is used as a material of the substrate 100, polyimide having excellent heat-resistance, which may be endured at a high temperature, may be used as the substrate 100 considering that a deposition process of high temperature is performed on the substrate 100.

The light-shielding layer 110 is patterned on the substrate 100. The light-shielding layer 110 serves to shield light from entering the active layer 130 from a lower portion of the substrate 100. Accordingly, the light-shielding layer 110 is formed to shield the active layer 130. The light-shielding layer 110 is formed to have an area having the same as or greater than that of the active layer 130.

The light-shielding layer 110 is made of a material excluding metal having excellent electric conductivity.

If the light-shielding layer 110 is made of a material of metal having excellent electric conductivity, parasitic capacitance occurs between the light-shielding layer 110 and the other electrodes, whereby driving characteristics of a device may be deteriorated. In order to prevent parasitic capacitance from occurring, the light-shielding layer 110 of metal may be connected with the gate electrode 150 to form a double gate structure. In this case, a problem occurs in that design and process steps for connection between the light-shielding layer 110 and the gate electrode 150 may be complicated.

Accordingly, the light-shielding layer 110 according to one embodiment of the present invention is made of a material having poor electric conductivity, specifically may be made of a semiconductor material such as amorphous silicon (a-Si) or black resin material.

Meanwhile, since a deposition process of high temperature more than 300° C. is performed to manufacture the thin film transistor according to the present invention, the material of the light-shielding layer 110 should endure the deposition process of high temperature. Considering this heat-resistant characteristics, the semiconductor material such as a-Si is used as the material of the light-shielding layer 110 more preferably than the black resin material.

If the semiconductor material such as a-Si is used as the material of the light-shielding layer 110, it is preferable that the semiconductor material has a thickness of 1000 Å to 3000 Å. If the thickness of the semiconductor material is less than 1000 Å, light-shielding effect may be reduced. If the thickness of the semiconductor material exceeds 3000 Å, light-shielding effect is little increased, whereas the total thickness of the thin film transistor is increased.

Figure 20:
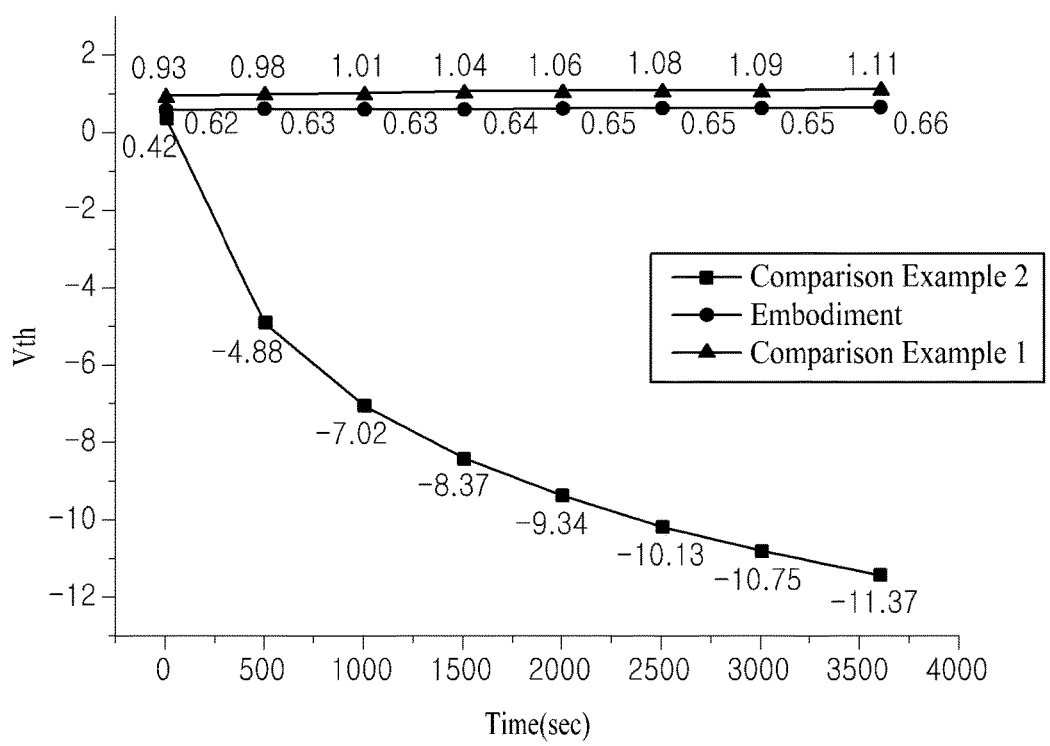
FIG. 20 is a graph illustrating light-shielding effect of amorphous silicon.

FIG. 20 is a graph illustrating light-shielding effect of amorphous silicon.

Referring to FIG. 20, a comparison example 1 is a graph illustrating Vth (Threshold voltage) variation based on time in a state that incident light is shielded although a light-shielding layer is not formed, a comparison example 2 is a graph illustrating Vth variation based on time in a state that a light-shielding layer is not formed and incident light is not shielded, and an embodiment is a graph illustrating Vth variation based on time in a state that a light-shielding layer of a-Si is formed and incident light is not shielded.

Since the comparison example 1 illustrates that incident light is shielded, the active layer is not affected by the light. Since the comparison example 2 illustrates that incident light is not shielded, the active layer is affected by the light. It is noted that the graph of the comparison example 2 illustrates that Vth variation is more serious than that of the comparison example 1.

On the other hand, since the embodiment illustrates that incident light is not shielded, the active layer may be affected by the light. Nonetheless, it is noted that the embodiment illustrates Vth behavior similar to that of the comparison example 1. Accordingly, it is noted from the graph of FIG. 20 that a-Si shields transmittance of light.

Referring to FIG. 2 again, the buffer layer 120 is formed on the entire surface of the substrate 100 including the light-shielding layer 110. The buffer layer 120 serves to prevent the material contained on the substrate 100 from being diffused to the active layer 130 during the deposition process of high temperature. Also, the buffer layer 120 may serve to prevent external water or moisture from being permeated into an organic light-emitting device if the thin film transistor according to the present invention is applied to the organic light-emitting device. The buffer 120 may be made of silicon oxide or silicon nitride. The buffer layer may be omitted as the case may be. In addition, it will be understood by those skilled in the art that the buffer layer 120 can be omitted in the thin film transistor substrate if necessary.

The active layer 130 is formed on the buffer layer 120. The active layer 130 may be made of, but not limited to, oxide semiconductor such as In—Ga—Zn—O (IGZO).

The gate insulating film 140 is patterned on the center portion of the active layer 130. The gate insulating film 140 serves to insulate the gate electrode 150 from the active layer 130.

The gate insulating film 140 may be made of, but not limited to, an inorganic insulating material such as silicon oxide or silicon nitride. The gate insulating film 140 may be made of an organic insulating material such as photo acryl or BCB.

The gate electrode 150 is patterned on the gate insulating film 140 to control electron transfer within the active layer 130. The gate electrode 150 may be patterned simultaneously with the gate insulating film 140. Accordingly, the gate electrode 150 may be formed at the same pattern as that of the gate insulating film 140. In this case, the meaning that the gate electrode 150 has the same pattern as that of the gate insulating film 140 should include a case where a fine difference occurs during process steps.

The gate electrode 150 may be made of Mo, Al, Cr, Au, Ti, Ni, Nd, Cu, or their alloy, or may be made of a single layer of each of the above metals or alloy or multi-layers not less than two layers of the above metals or alloy.

The insulating interlayer 160 is formed on the gate electrode 150 and the active layer 130. Especially, the insulating interlayer 160 is formed on the entire surface of the substrate. However, since the insulating interlayer 160 includes a first contact hole CH1 in a predetermined area, one end area and the other end area of the active layer 130 are exposed by the first contact hole CH1.

The insulating interlayer 160 may be made of, but not limited to, an inorganic insulating material such as silicon oxide or silicon nitride. The insulating interlayer 160 may be made of an organic insulating material such as photo acryl or BCB.

The source electrode 170a and the drain electrode 170b are patterned on the insulating interlayer 160 to face each other.

The source electrode 170a is connected with the one end area of the active layer 130 through the first contact hole CH1, and the drain electrode 170b is connected with the other end area of the active layer 130 through the first contact hole CH1.

Each of the source electrode 170a and the drain electrode 170b may be made of Mo, Al, Cr, Au, Ti, Ni, Nd, Cu, or their alloy, or may be made of a single layer of each of the above metals or alloy or multi-layers not less than two layers of the above metals or alloy.

The passivation film 180 is formed on the source electrode 170a and the drain electrode 170b. Especially, the passivation film 180 is formed on the entire surface of the substrate. However, since the passivation film 180 includes a second contact hole CH2 in a predetermined area, a predetermined area of the drain electrode 170b is exposed by the second contact hole CH2. In addition, it will be understood by those skilled in the art that the passivation film 180 can be omitted in the thin film transistor substrate if necessary.

The passivation film 180 may be made of, but not limited to, an inorganic insulating material such as silicon oxide or silicon nitride. The passivation film 180 may be made of an organic insulating material such as photo acryl or BCB.

The pixel electrode 190 is patterned on the passivation film 180. Particularly, the pixel electrode 190 is connected with the exposed drain electrode 170b through the second contact hole CH2.

The pixel electrode 190 may be made of, but not limited to, a transparent metal oxide such as ITO. The pixel electrode 190 may be made of an opaque metal as the case may be.

Figure 3:
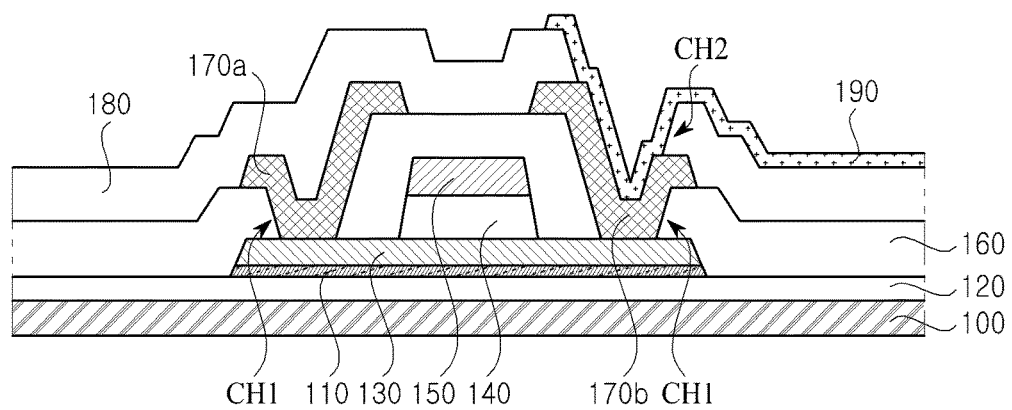
FIG. 3 is a cross-sectional view illustrating a thin film transistor substrate according to another embodiment of the present invention.

FIG. 3 is a cross-sectional view illustrating a thin film transistor substrate according to another embodiment of the present invention. The thin film transistor substrate of FIG. 3 is the same as that of FIG. 2 except that a position of the light-shielding layer 110 is varied. Accordingly, the same reference numbers will be used throughout the drawings to refer to the same or like parts, and repeated description of the same or like parts will be omitted.

FIGS. 4A to 4G are cross-sectional views illustrating process steps of a method of manufacturing a thin film transistor substrate according to one embodiment of the present invention, and relate to process steps of the thin film transistor substrate of FIG. 2. Hereinafter, repeated description in material and structure of each element will be omitted.

Figure 4A:
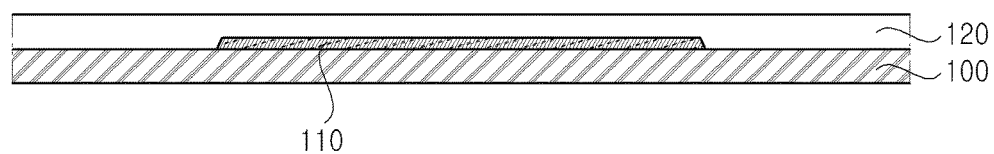
FIGS. 4A to 4G are cross-sectional views illustrating process steps of a method of manufacturing a thin film transistor substrate according to one embodiment of the present invention.

First, as shown in FIG. 4A, the light-shielding layer 110 is patterned on the substrate 100, and the buffer layer 120 is formed on the entire surface of the substrate 100 including the light-shielding layer 110. In addition, it will be understood by those skilled in the art that the buffer layer 120 can be omitted in the thin film transistor substrate if necessary.

The light-shielding layer 110 may be formed in such a manner that a-Si is deposited using a plasma enhanced chemical vapor deposition (PECVD) method, and then patterned using a mask process (first mask process) of a photoresist deposition, exposure, development, etching and stripping. Hereinafter, patterning of each element, which will be described later, may be performed using the above mask process of exposure, development, etching and stripping.

The buffer layer 120 may be formed using the PECVD method.

Figure 4B:
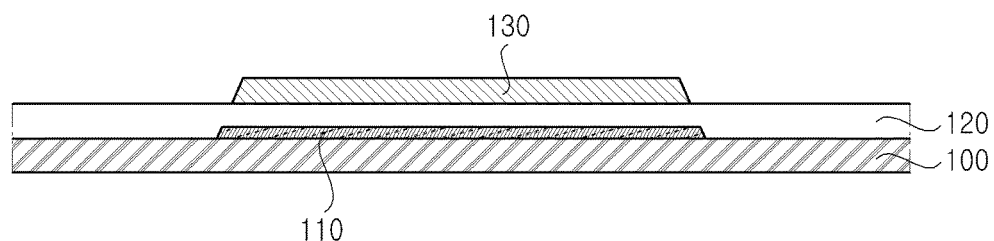

Next, as shown in FIG. 4B, the active layer 130 is patterned on the buffer layer 120.

The active layer 130 may be formed in such a manner that an amorphous oxide semiconductor such as a-IGZO is deposited on the buffer layer 120 by using sputtering or metal organic chemical vapor deposition (MOCVD), crystallized by performing a heat-treatment process of high temperature more than 650° C. through a furnace or rapid thermal process (RTP), and patterned by a mask process (second mask process).

Figure 4C:
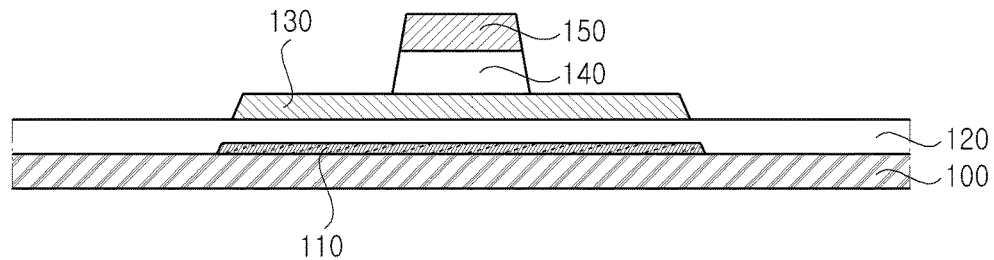

Next, as shown in FIG. 4C, the gate insulating film 140 and the gate electrode 150 are patterned on the active layer 130.

The gate insulating film 140 and the gate electrode 150 may be formed in such a manner that a layer for the gate insulating film 140 is deposited on the active layer 130 by PECVD, a layer for the gate electrode 150 is deposited by sputtering, and the layer for the gate insulating film 140 and the layer for the gate electrode 150 are patterned by a mask process (third mask process).

As described above, if the gate insulating film 140 and the gate electrode 150 are formed by one mask process, they are formed at the same pattern.

Figure 4D:
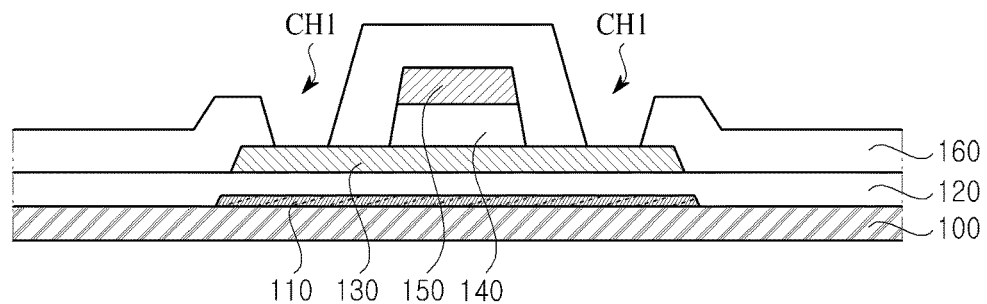

Next, as shown in FIG. 4D, the insulating interlayer 160 is patterned on the active layer 130 and the gate electrode 150.

The insulating interlayer 160 is patterned by a mask process (fourth mask process) to have a first contact hole CH1 that exposes one end area and the other end area of the active layer 130.

Figure 4E:
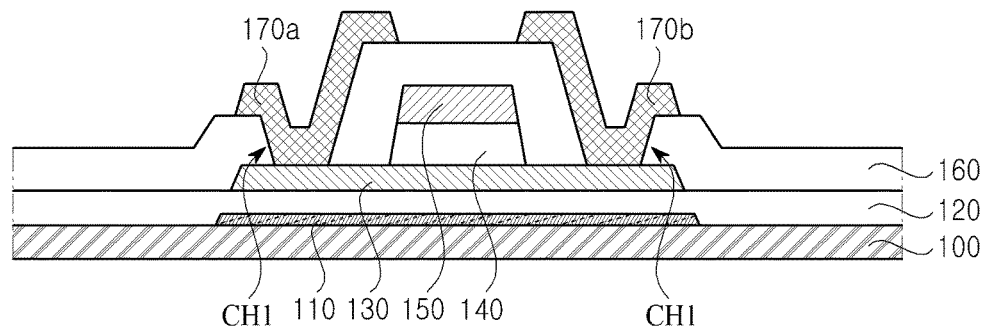

Next, as shown in FIG. 4E, the source electrode 170a and the drain electrode 170b are patterned on the insulating interlayer 160.

The source electrode 170a and the drain electrode 170b are patterned by a mask process (fifth mask process) to be connected with the one end area and the other end area of the active layer 130 through the first contact hole CH1.

Figure 4F:
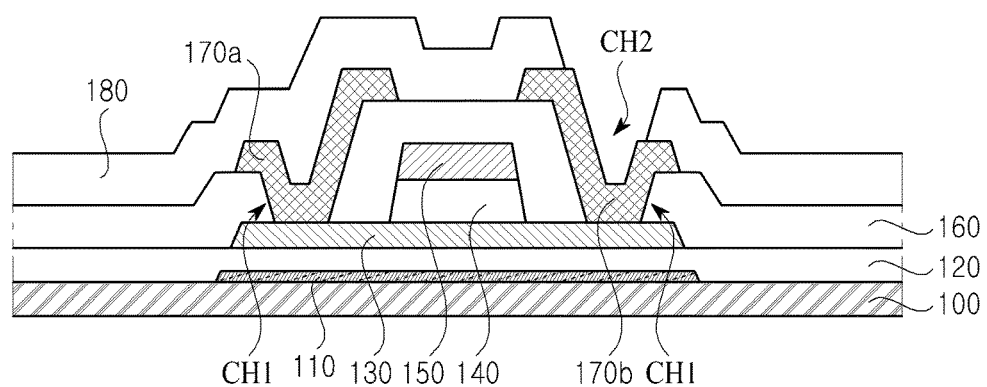

Next, as shown in FIG. 4F, the passivation film 180 is patterned on the source electrode 170a and the drain electrode 170b.

The passivation film 180 is patterned by a mask process (sixth mask process) to have a second contact hole CH2 that exposes the drain electrode 170b. In addition, it will be understood by those skilled in the art that the passivation film 180 can be omitted in the thin film transistor substrate if necessary.

Figure 4G:
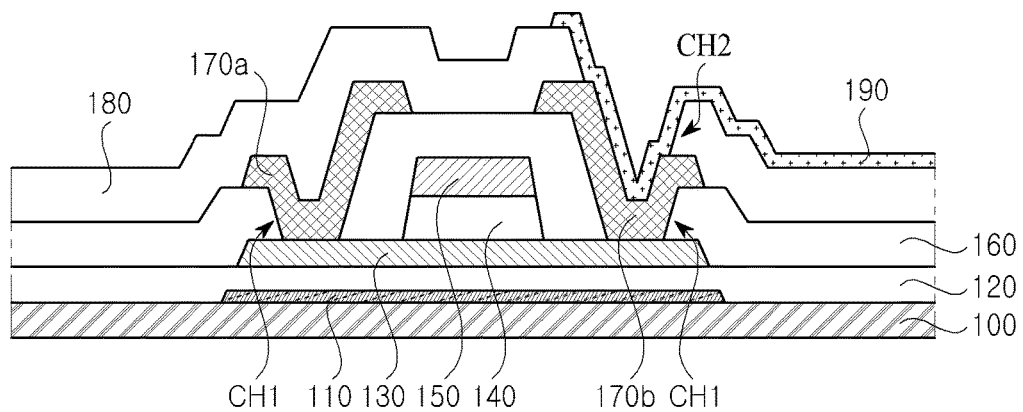

Next, as shown in FIG. 4G, the pixel electrode 190 is patterned on the passivation film 180.

The pixel electrode 190 is patterned by a mask process (seventh mask process) to be connected with the drain electrode 170b through the second contact hole CH2.

FIGS. 5A to 5F are cross-sectional views illustrating process steps of a method of manufacturing a thin film transistor substrate according to another embodiment of the present invention, and relate to process steps of the thin film transistor substrate of FIG. 3. Hereinafter, repeated description with respect to the aforementioned embodiment will be omitted.

Figure 5A:
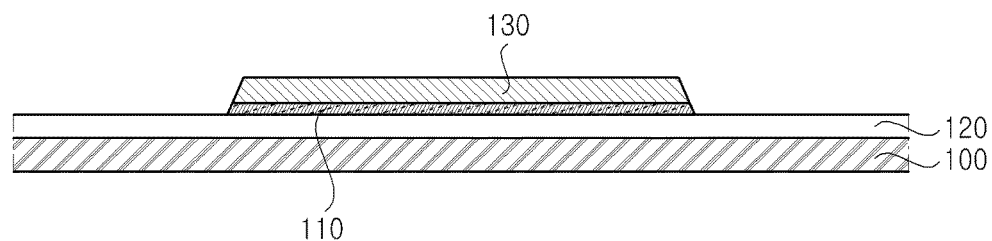
FIGS. 5A to 5F are cross-sectional views illustrating process steps of a method of manufacturing a thin film transistor substrate according to another embodiment of the present invention.

First, as shown in FIG. 5A, the buffer layer 120 is formed on the entire surface of the substrate 100, and the light-shielding layer 110 and the active layer 130 are patterned on the buffer layer 120.

The light-shielding layer 110 and the active layer 130 may be formed in such a manner that a-Si is deposited on the buffer layer 120 using a plasma enhanced chemical vapor deposition (PECVD) method, an amorphous oxide semiconductor such as a-IGZO is deposited by using sputtering or metal organic chemical vapor deposition (MOCVD), the amorphous oxide semiconductor is crystallized by performing a heat-treatment process of high temperature more than 650° C. through a furnace or rapid thermal process (RTP), and the a-Si and the oxide semiconductor are together patterned by a mask process (first mask process).

As described above, if the light-shielding layer 110 and the active layer 130 are formed by one mask process, they are formed at the same pattern.

Figure 5B:
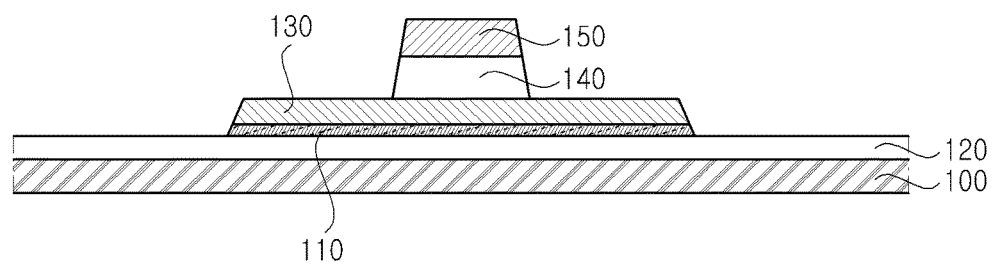

Next, as shown in FIG. 5B, the gate insulating film 140 and the gate electrode 150 are formed on the active layer 130.

The gate insulating film 140 and the gate electrode 150 may together be patterned by one mask process (second mask process).

Figure 5C:
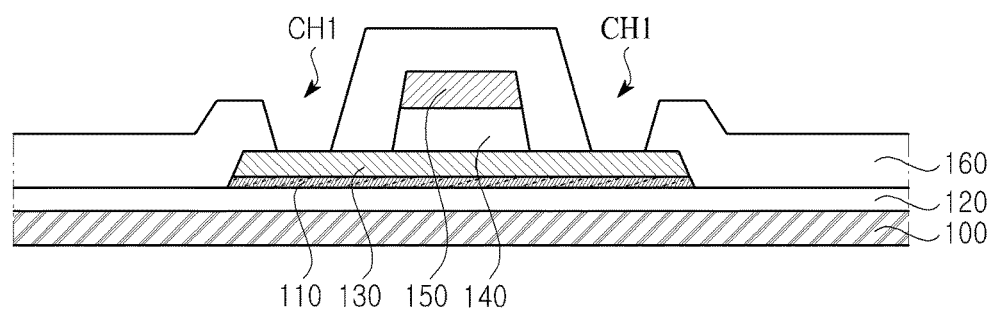

Next, as shown in FIG. 5C, the insulating interlayer 160 is patterned on the active layer 130 and the gate electrode 150 by a mask process (third mask process).

Figure 5D:
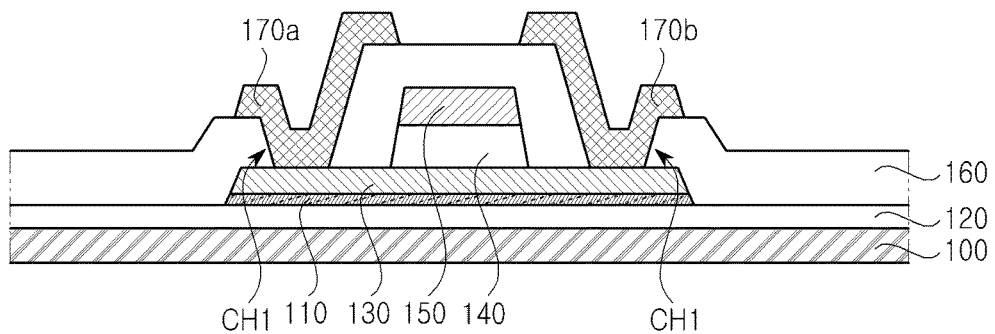

Next, as shown in FIG. 5D, the source electrode 170a and the drain electrode 170b are patterned on the insulating interlayer 160 by a mask process (fourth mask process).

Figure 5E:
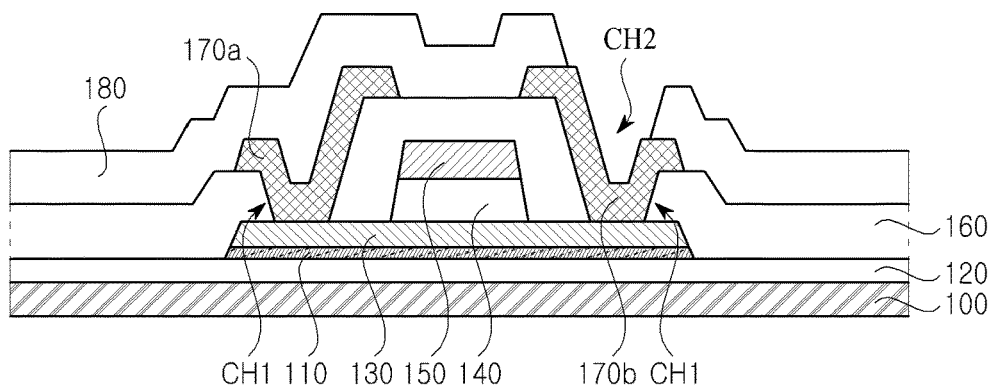

Next, as shown in FIG. 5E, the passivation film 180 is patterned on the source electrode 170a and the drain electrode 170b by a mask process (fifth mask process).

Figure 5F:
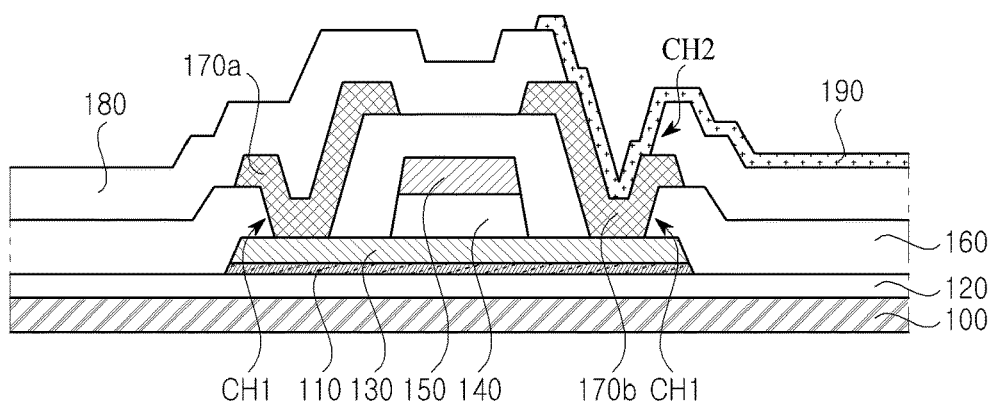

Next, as shown in FIG. 5F, the pixel electrode 190 is patterned on the passivation film 180 by a mask process (sixth mask process). Repeated description of the same elements as those of the aforementioned embodiments will be omitted in the following embodiments.

Figure 6:
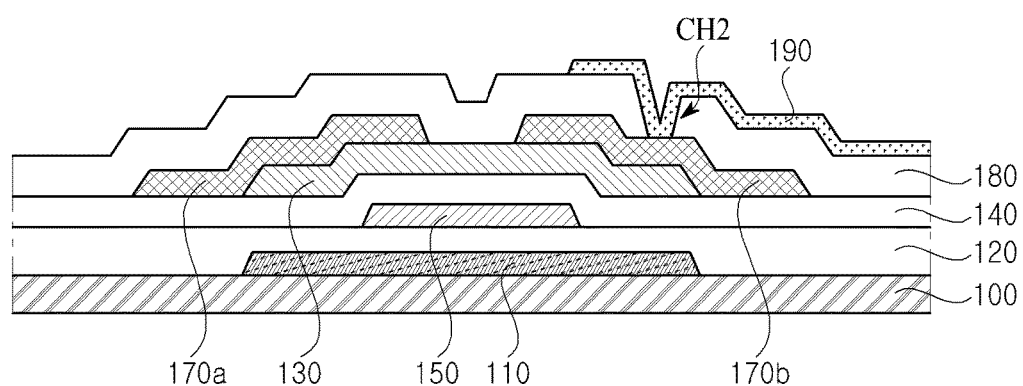
FIG. 6 is a cross-sectional view illustrating a thin film transistor substrate according to still another embodiment of the present invention.

FIG. 6 is a cross-sectional view illustrating a thin film transistor substrate according to still another embodiment of the present invention.

As shown in FIG. 6, the thin film transistor substrate according to still another embodiment of the present invention includes a substrate 100, a light-shielding layer 110, a buffer layer 120, a gate electrode 150, a gate insulating film 140, an active layer 130, a source electrode 170a, a drain electrode 170b, a passivation film 180, and a pixel electrode 190.

The light-shielding layer 110 is patterned on the substrate 100.

The buffer layer 120 is formed on the entire surface of the substrate 100 including the light-shielding layer 110.

The gate electrode 150 is patterned on the buffer layer 120.

The gate insulating film 140 is formed on the entire surface of the substrate 100 including the gate electrode 150.

The active layer 130 is patterned on the gate insulating film 140.

The source electrode 170a and the drain electrode 170b are patterned on the active layer 130 to face each other. Particularly, the source electrode 170a is patterned on one end area of the active layer 130, and the drain electrode 170b is patterned on the other end area of the active layer 130.

The passivation film 180 is formed on the entire surface of the substrate including the source electrode 170a and the drain electrode 170b. However, since the passivation film 180 is provided with a second contact hole CH2, a predetermined area of the drain electrode 170b is exposed by the second contact hole CH2.

The pixel electrode 190 is patterned on the passivation film 180. Particularly, the pixel electrode 190 is connected with the exposed predetermined area of the drain electrode 170b through the second contact hole CH2.

In case of the embodiment of FIG. 6 as described above, since the light-shielding layer 110 may prevent light from being irradiated to the active layer 130, the size of the gate electrode 150 may be reduced. Accordingly, restriction in designing the thin film transistor may be reduced, and parasitic capacitance between the gate electrode 150 and the source electrode 170a and between the gate electrode 150 and the drain electrode 170b may be reduced to enable high speed driving of the device.

Figure 7:
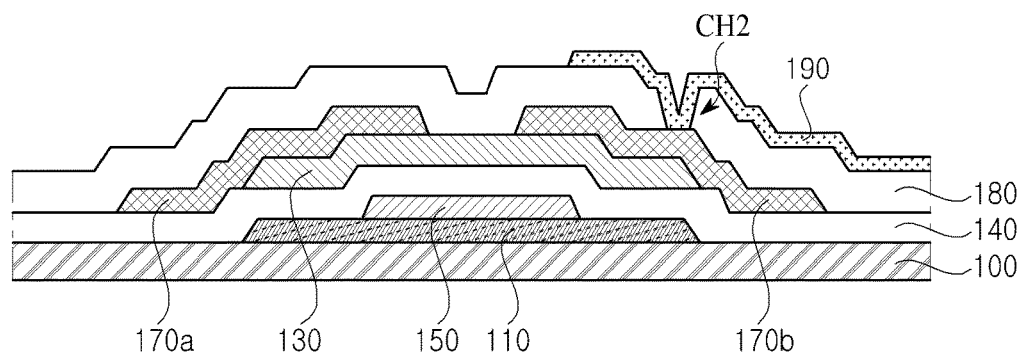
FIG. 7 is a cross-sectional view illustrating a thin film transistor substrate according to further still another embodiment of the present invention.

FIG. 7 is a cross-sectional view illustrating a thin film transistor substrate according to further still another embodiment of the present invention. The thin film transistor substrate of FIG. 7 is the same as that of FIG. 6 except that the buffer layer 120 is not formed between the light-shielding layer 110 and the gate electrode 150.

As shown in FIG. 7, the gate electrode 150 is directly formed on the light-shielding layer 110, whereby the gate electrode 150 is directly in contact with the light-shielding layer 110.

FIGS. 8A to 8E are cross-sectional views illustrating process steps of a method of manufacturing a thin film transistor substrate according to still another embodiment of the present invention, and relate to process steps of the aforementioned thin film transistor substrate of FIG. 6.

Figure 8A:
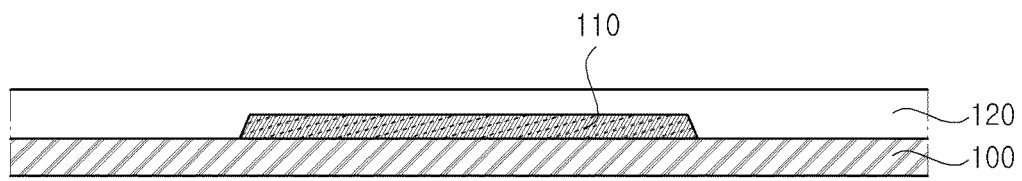
FIGS. 8A to 8E are cross-sectional views illustrating process steps of a method of manufacturing a thin film transistor substrate according to still another embodiment of the present invention.

First, as shown in FIG. 8A, the light-shielding layer 110 is patterned on the substrate 100, and the buffer layer 120 is formed on the entire surface of the substrate 100 including the light-shielding layer 110. The light-shielding layer 110 may be patterned using a first mask process.

Figure 8B:
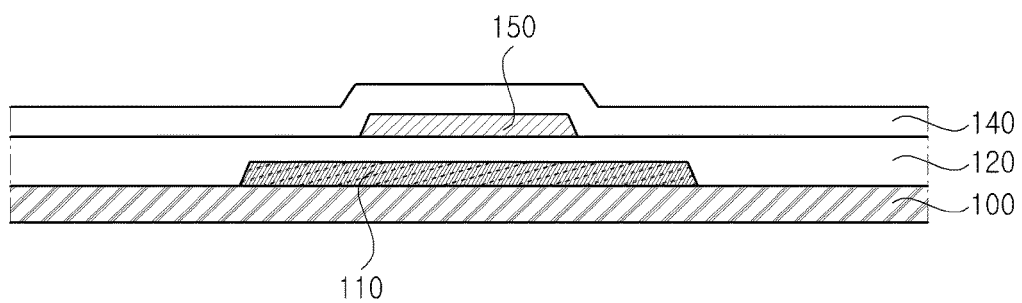

Next, as shown in FIG. 8B, the gate electrode 150 is patterned on the buffer layer 120, and the gate insulating film 140 is formed on the entire surface of the substrate 100 including the gate electrode 150. The gate electrode 150 may be patterned using a second mask process.

Figure 8C:
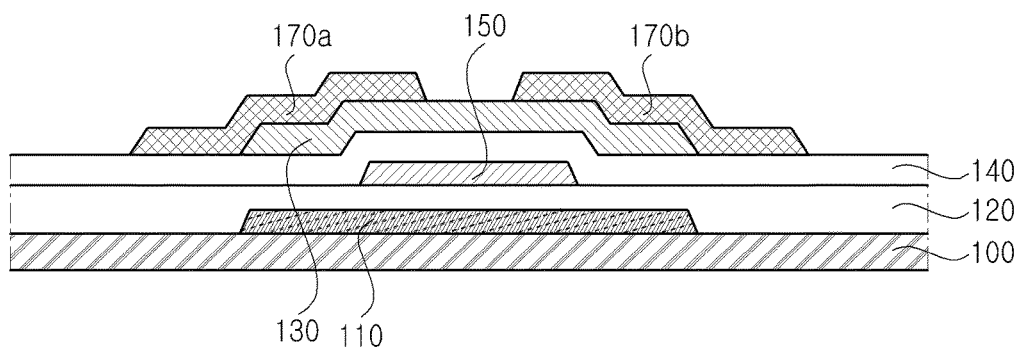

Next, as shown in FIG. 8C, the active layer 130 is patterned on the gate insulating film 140, and the source electrode 170a and the drain electrode 170b are patterned on the active layer 130. The active layer 130 may be patterned using a third mask process, and the source drain electrode 170a and the drain electrode 170b may be patterned using a fourth mask process.

Figure 8D:
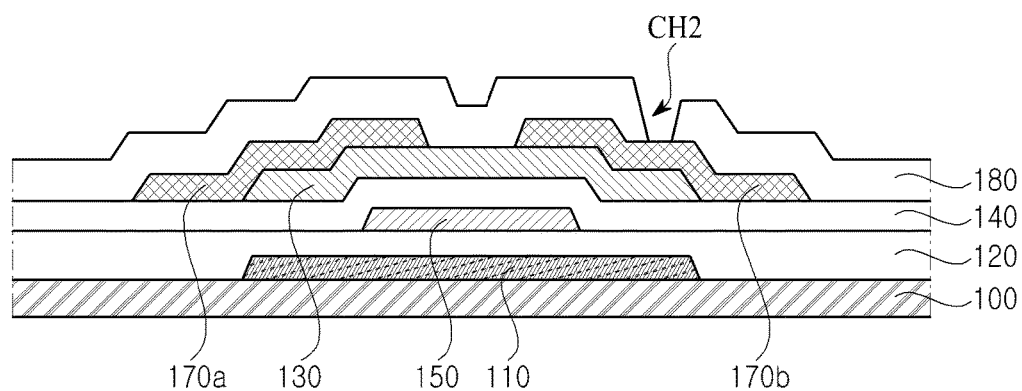

Next, as shown in FIG. 8D, the passivation film 180 is patterned on the source electrode 170a and the drain electrode 170b. The passivation film 180 may be patterned using a fifth mask process to have the second contact hole CH2 that exposes the drain electrode 170b.

Figure 8E:
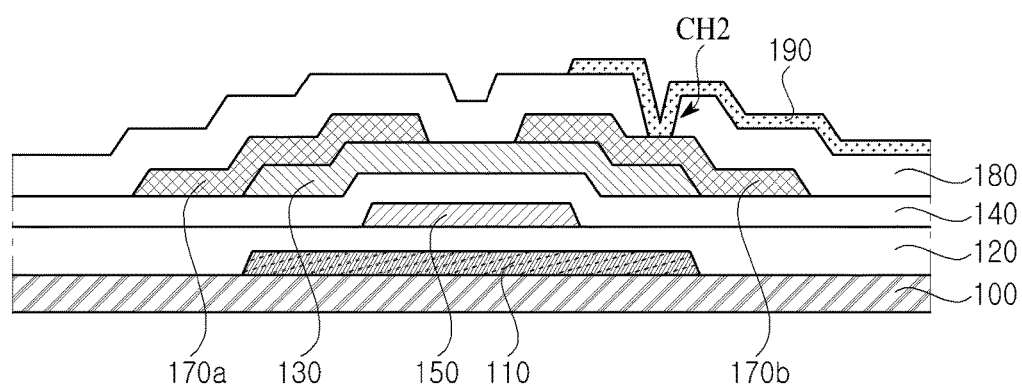

Next, as shown in FIG. 8E, the pixel electrode 190 is patterned on the passivation film 180. The pixel electrode 190 may be patterned using a sixth mask process to be connected with the drain electrode 170b through the second contact hole CH2.

FIGS. 9A to 9E are cross-sectional views illustrating process steps of a method of manufacturing a thin film transistor substrate according to still another embodiment of the present invention, and relate to process steps of the aforementioned thin film transistor substrate of FIG. 7.

Figure 9A:
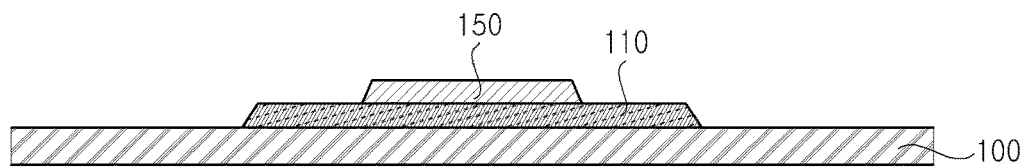
FIGS. 9A to 9E are cross-sectional views illustrating process steps of a method of manufacturing a thin film transistor substrate according to further still another embodiment of the present invention.

First, as shown in FIG. 9A, the light-shielding layer 110 and the gate electrode 150 are patterned on the substrate 100.

The light-shielding layer 110 is patterned on the substrate 100, and the gate electrode 150 is patterned on the light-shielding layer 110. The light-shielding layer 110 and the gate electrode 150 may be patterned by a first mask process through an exposure process of one time using a halftone mask.

Figure 9B:
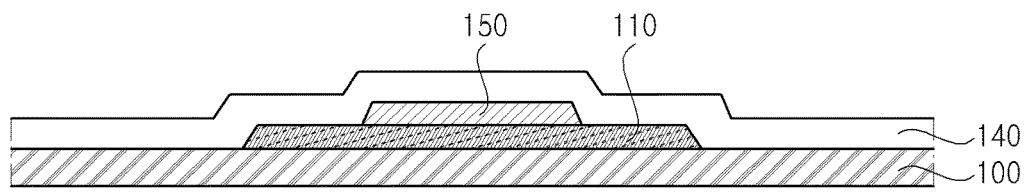

Next, as shown in FIG. 9B, the gate insulating film 140 is formed on the entire surface of the substrate 100 including the gate electrode 150.

Figure 9C:
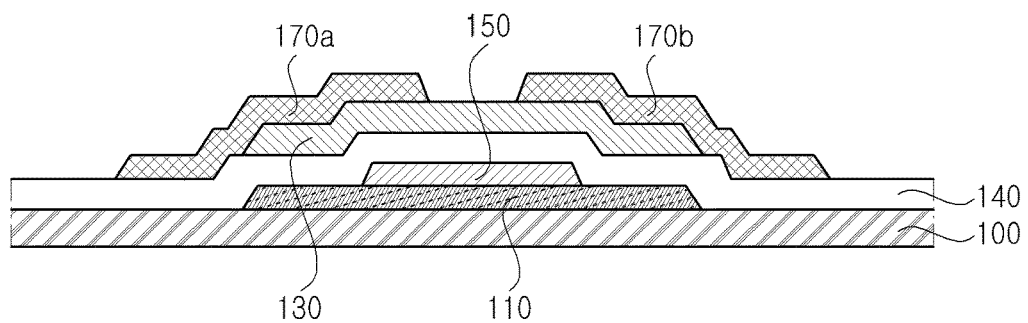

Next, as shown in FIG. 9C, the active layer 130 is patterned on the gate insulating film 140, and the source electrode 170a and the drain electrode 170b are patterned on the active layer 130. The active layer 130 may be patterned using a second mask process, and the source drain electrode 170a and the drain electrode 170b may be patterned using a third mask process.

Figure 9D:
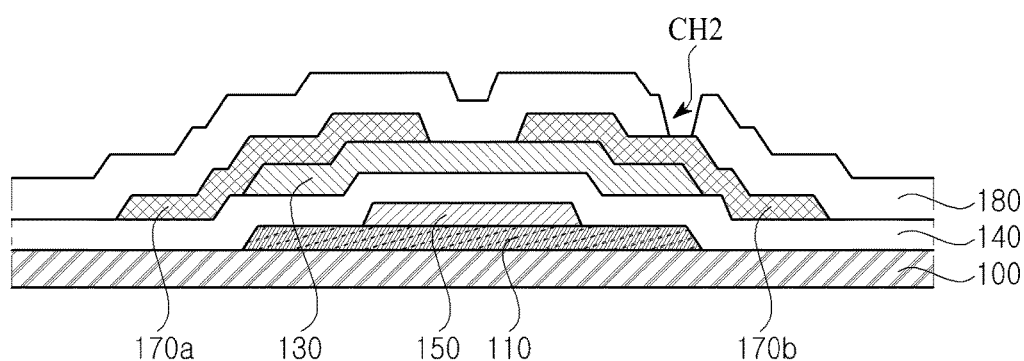

Next, as shown in FIG. 9D, the passivation film 180 is patterned on the source electrode 170a and the drain electrode 170b. The passivation film 180 may be patterned using a fourth mask process to have the second contact hole CH2 that exposes the drain electrode 170b.

Figure 9E:
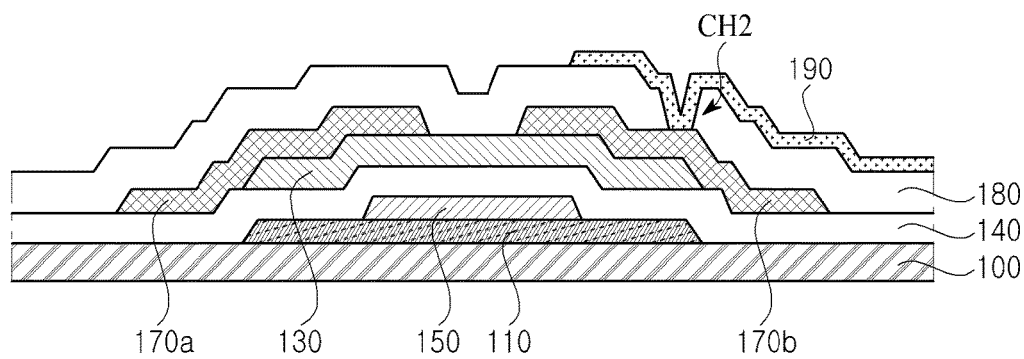

Next, as shown in FIG. 9E, the pixel electrode 190 is patterned on the passivation film 180. The pixel electrode 190 may be patterned using a fifth mask process to be connected with the drain electrode 170b through the second contact hole CH2.

Figure 10:
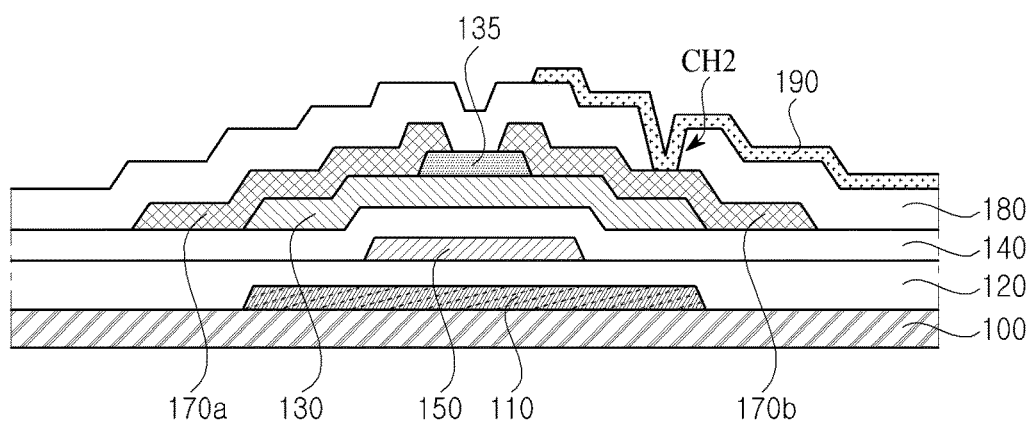
FIG. 10 is a cross-sectional view illustrating a thin film transistor substrate according to further still another embodiment of the present invention.

FIG. 10 is a cross-sectional view illustrating a thin film transistor substrate according to further still another embodiment of the present invention. The thin film transistor substrate of FIG. 10 is the same as that of FIG. 6 except that an etch stopper 135 is additionally formed between the active layer 130 and the source electrode 170a and between the active layer 130 and the drain electrode 170b.

As shown in FIG. 10, the light-shielding layer 110, the buffer layer 120, the gate electrode 150, the gate insulating film 140 and the active layer 130 are sequentially formed on the substrate 100.

The etch stopper 135 is formed on the active layer 130. The etch stopper 135 serves to prevent a channel area of the active layer 130 from being etched. The etch stopper 135 may be formed of, but not limited to, an inorganic insulating film such as silicon nitride.

The source electrode 170a and the drain electrode 170b are patterned on the etch stopper 135 to face each other, and the passivation film 180 provided with the second contact hole CH2 is formed on the source electrode 170a and the drain electrode 170b. The pixel electrode 190 connected with the exposed predetermined area of the drain electrode 170b through the second contact hole CH2 is formed on the passivation film 180.

Figure 11:
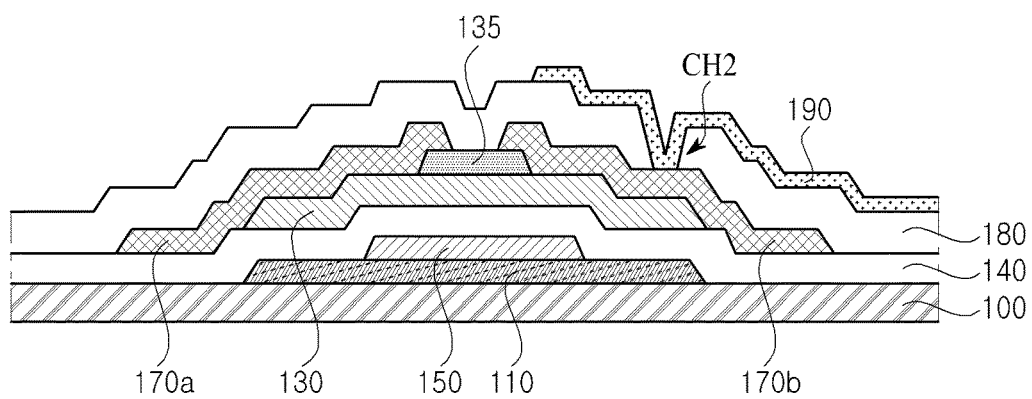
FIG. 11 is a cross-sectional view illustrating a thin film transistor substrate according to further still another embodiment of the present invention.

FIG. 11 is a cross-sectional view illustrating a thin film transistor substrate according to further still another embodiment of the present invention. The thin film transistor substrate of FIG. 11 is the same as that of FIG. 10 except that the buffer layer 120 is not formed between the light-shielding layer 110 and the gate electrode 150.

As shown in FIG. 11, the gate electrode 150 is directly formed on the light-shielding layer 110, whereby the gate electrode 150 is directly in contact with the light-shielding layer 110.

FIGS. 12A to 12F are cross-sectional views illustrating process steps of a method of manufacturing a thin film transistor substrate according to still another embodiment of the present invention, and relate to process steps of the aforementioned thin film transistor substrate of FIG. 10.

Figure 12A:
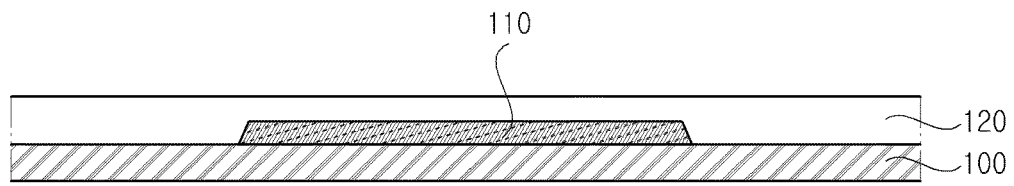
FIGS. 12A to 12F are cross-sectional views illustrating process steps of a method of manufacturing a thin film transistor substrate according to further still another embodiment of the present invention.

First, as shown in FIG. 12A, the light-shielding layer 110 is patterned on the substrate 100, and the buffer layer 120 is formed on the entire surface of the substrate 100 including the light-shielding layer 110. The light-shielding layer 110 may be patterned using a first mask process.

Figure 12B:
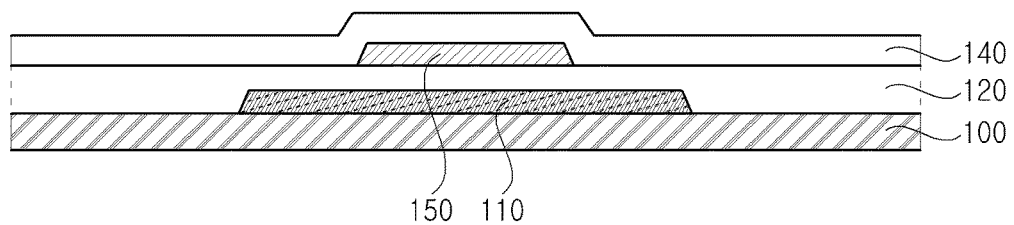

Next, as shown in FIG. 12B, the gate electrode 150 is patterned on the buffer layer 120, and the gate insulating film 140 is formed on the entire surface of the substrate 100 including the gate electrode 150. The gate electrode 150 may be patterned using a second mask process.

Figure 12C:
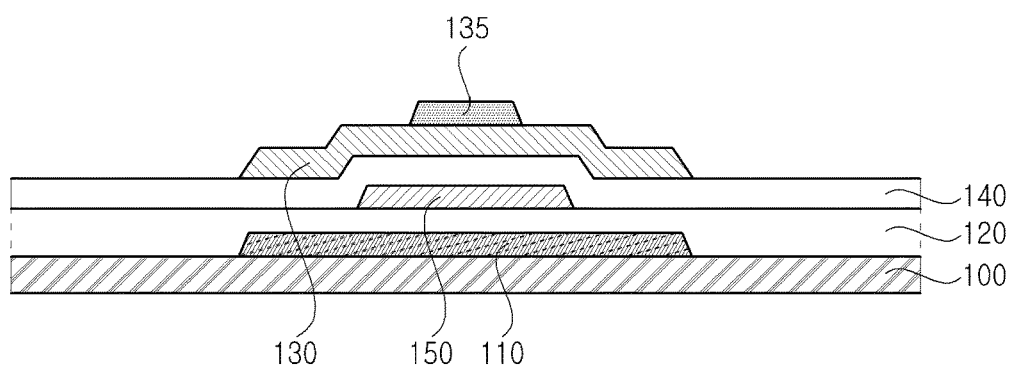

Next, as shown in FIG. 12C, the active layer 130 is patterned on the gate insulating film 140, and the etch stopper 135 is patterned on the active layer 130. The active layer 130 may be patterned using a third mask process, and the etch stopper 135 may be patterned using a fourth mask process.

Figure 12D:
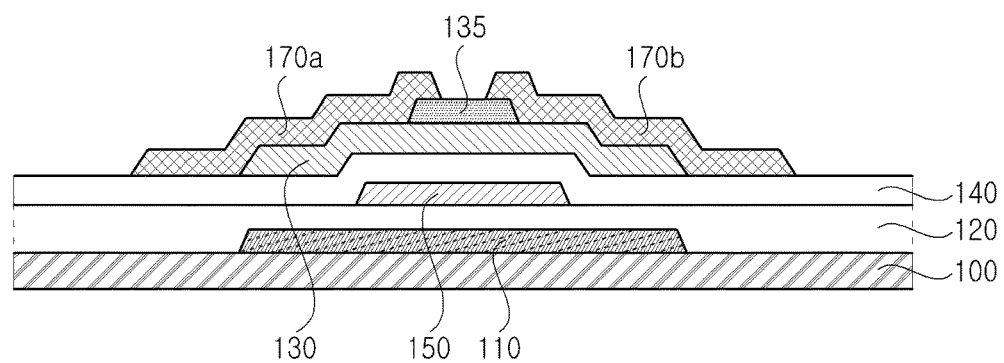

Next, as shown in FIG. 12D, the source drain electrode 170a and the drain electrode 170b are patterned on the etch stopper 135. The source electrode 170a and the drain electrode 170b may be patterned using a fifth mask process.

Figure 12E:
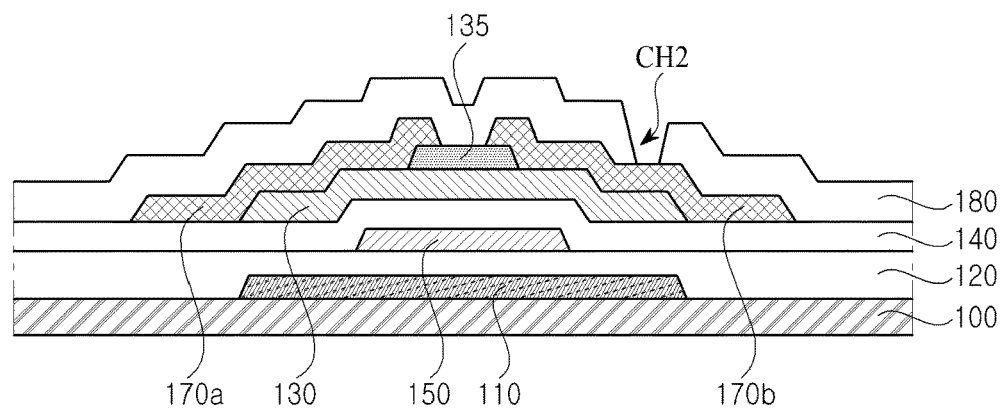

Next, as shown in FIG. 12E, the passivation film 180 is patterned on the source electrode 170a and the drain electrode 170b. The passivation film 180 may be patterned using a sixth mask process to have the second contact hole CH2 that exposes the drain electrode 170b.

Figure 12F:
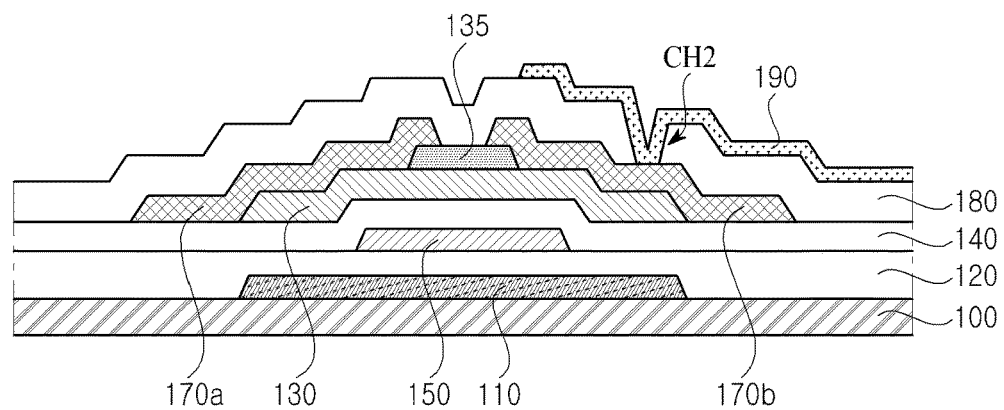

Next, as shown in FIG. 12F, the pixel electrode 190 is patterned on the passivation film 180. The pixel electrode 190 may be patterned using a seventh mask process to be connected with the drain electrode 170b through the second contact hole CH2.

FIGS. 13A to 13F are cross-sectional views illustrating process steps of a method of manufacturing a thin film transistor substrate according to still another embodiment of the present invention, and relate to process steps of the aforementioned thin film transistor substrate of FIG. 11.

Figure 13A:
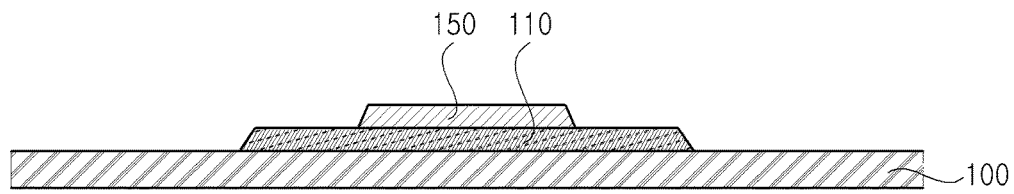
FIGS. 13A to 13F are cross-sectional views illustrating process steps of a method of manufacturing a thin film transistor substrate according to further still another embodiment of the present invention.

First, as shown in FIG. 13A, the light-shielding layer 110 and the gate electrode 150 are patterned on the substrate 100.

The light-shielding layer 110 and the gate electrode 150 may be patterned by a first mask process through an exposure process of one time using a halftone mask.

Figure 13B:
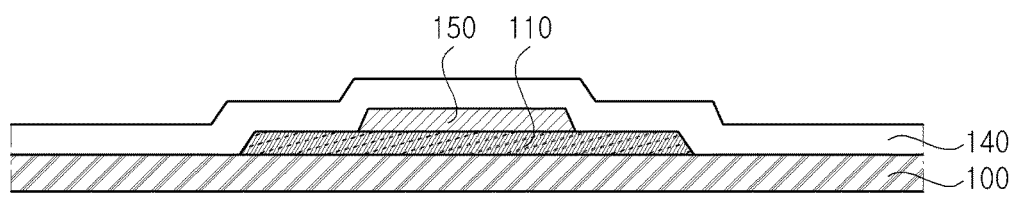

Next, as shown in FIG. 13B, the gate insulating film 140 is formed on the entire surface of the substrate 100 including the gate electrode 150.

Figure 13C:
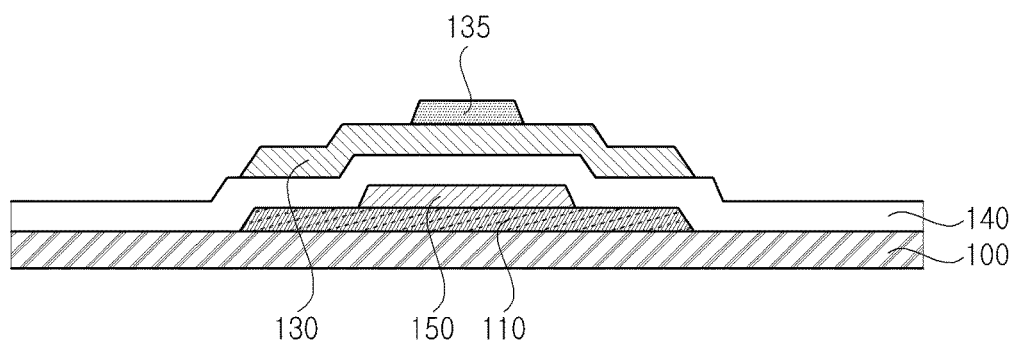

Next, as shown in FIG. 13C, the active layer 130 is patterned on the gate insulating film 140, and the etch stopper 135 is patterned on the active layer 130. The active layer 130 may be patterned using a second mask process, and the etch stopper 135 may be patterned using a third mask process.

Figure 13D:
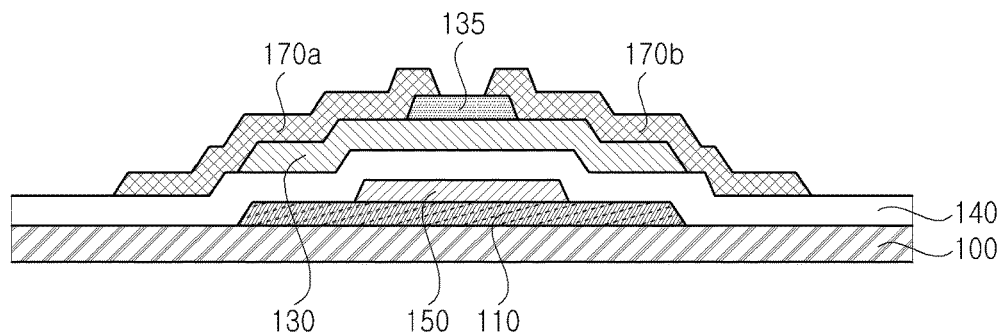

Next, as shown in FIG. 13D, the source electrode 170a and the drain electrode 170b are patterned on the etch stopper 135. The source electrode 170a and the drain electrode 170b may be patterned using a fourth mask process.

Figure 13E:
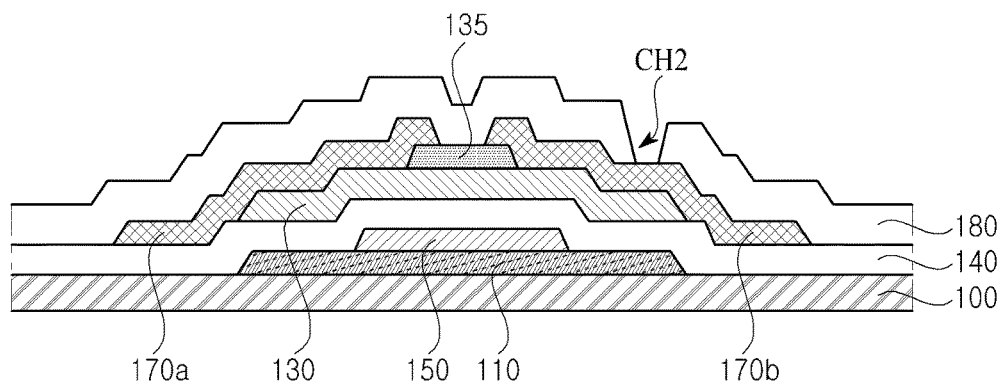

Next, as shown in FIG. 13E, the passivation film 180 is patterned on the source electrode 170a and the drain electrode 170b. The passivation film 180 may be patterned using a fifth mask process to have the second contact hole CH2 that exposes the drain electrode 170b.

Figure 13F:
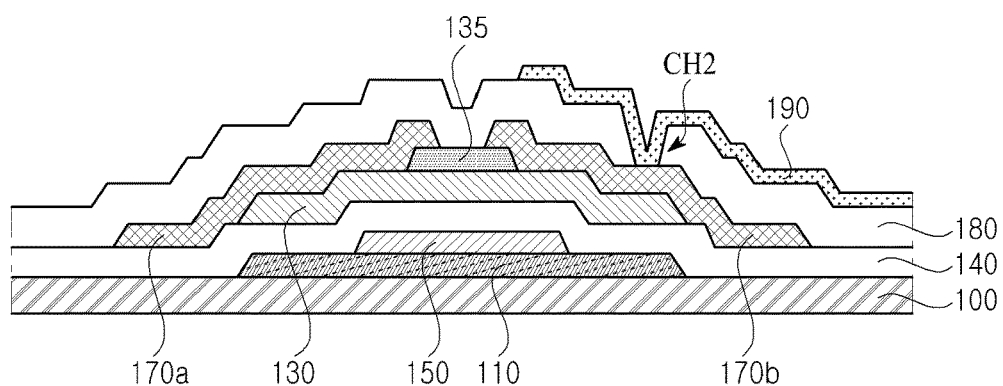

Next, as shown in FIG. 13F, the pixel electrode 190 is patterned on the passivation film 180. The pixel electrode 190 may be patterned using a sixth mask process to be connected with the drain electrode 170b through the second contact hole CH2.

Figure 14:
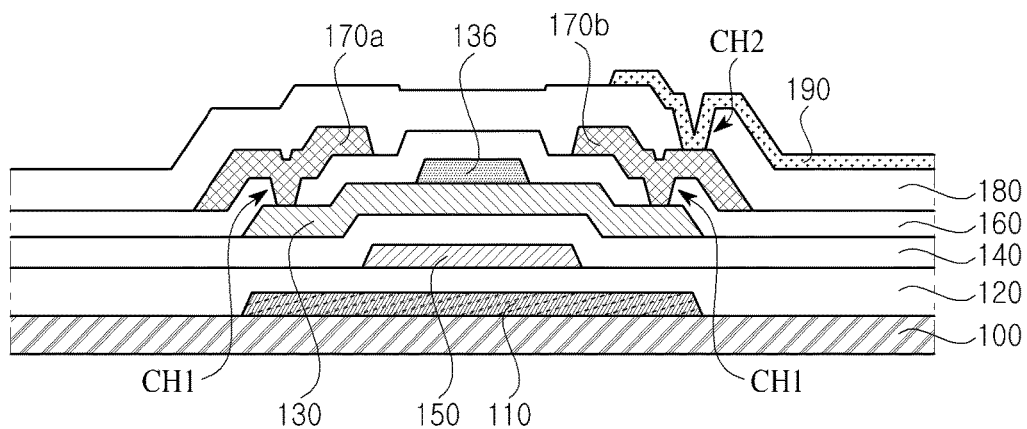
FIG. 14 is a cross-sectional view illustrating a thin film transistor substrate according to further still another embodiment of the present invention.

FIG. 14 is a cross-sectional view illustrating a thin film transistor substrate according to further still another embodiment of the present invention.

As shown in FIG. 14, the light-shielding layer 110, the buffer layer 120, the gate electrode 150, the gate insulating film 140 and the active layer 130 are sequentially formed on the substrate 100.

A mask layer 136 is formed on the active layer 130. The mask layer 136 covers a channel area of the active layer 130, whereby a conducting process may be performed in only an area other than the channel area. Namely, a center area of the active layer 130, which is covered with the mask layer 136, is a channel for transfer of electrons, and has semiconductor properties, and one end area and the other end area of the active layer 130, which are not covered with the mask layer 136, may be layers having excellent electrical conductivity through the conducting process which will be described later, whereby electron transfer may be performed more actively.

The mask layer 136 may be formed of, but not limited to, an inorganic insulating film such as silicon nitride.

An insulating interlayer 160 is formed on the entire surface of the substrate including the mask layer 136. However, since the insulating interlayer 160 has a first contact hole CH1 in a predetermined area, one end area and the other end area of the conducted active layer 130 are exposed by the first contact hole CH1.

The source electrode 170a connected with one end area of the active layer 130 through the first contact hole CH1 and the drain electrode 170b connected with the other end area of the active layer 130 through the first contact hole CH1 are formed on the insulating interlayer 160 to face each other.

The passivation film 180 provided with the second contact hole CH2 is formed on the source electrode 170a and the drain electrode 170b, and the pixel electrode 190 connected with the exposed predetermined area of the drain electrode 170b through the second contact hole CH2 is formed on the passivation film 180.

Figure 15:
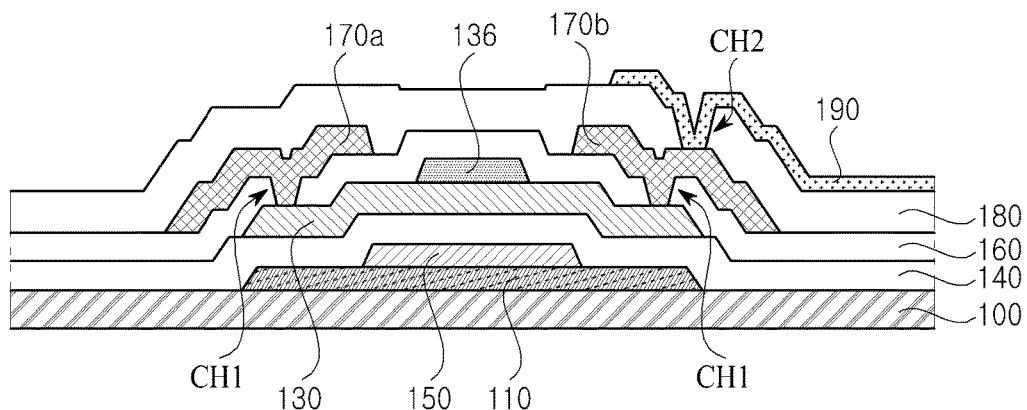
FIG. 15 is a cross-sectional view illustrating a thin film transistor substrate according to further still another embodiment of the present invention.

FIG. 15 is a cross-sectional view illustrating a thin film transistor substrate according to further still another embodiment of the present invention. The thin film transistor substrate of FIG. 15 is the same as that of FIG. 14 except that the buffer layer 120 is not formed between the light-shielding layer 110 and the gate electrode 150.

As shown in FIG. 15, the gate electrode 150 is directly formed on the light-shielding layer 110, whereby the gate electrode 150 is directly in contact with the light-shielding layer 110.

FIGS. 16A to 16G are cross-sectional views illustrating process steps of a method of manufacturing a thin film transistor substrate according to still another embodiment of the present invention, and relate to process steps of the aforementioned thin film transistor substrate of FIG. 14.

Figure 16A:
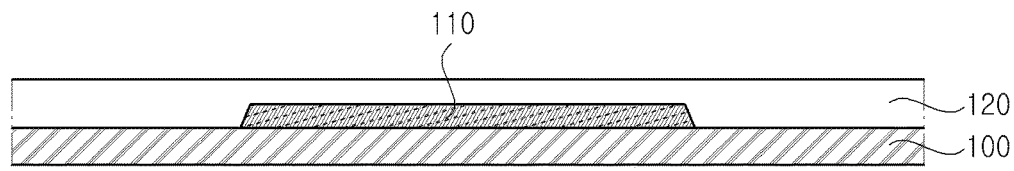
FIGS. 16A to 16G are cross-sectional views illustrating process steps of a method of manufacturing a thin film transistor substrate according to further still another embodiment of the present invention.

First, as shown in FIG. 16A, the light-shielding layer 110 is patterned on the substrate 100, and the buffer layer 120 is formed on the entire surface of the substrate 100 including the light-shielding layer 110. The light-shielding layer 110 may be patterned using a first mask process.

Figure 16B:
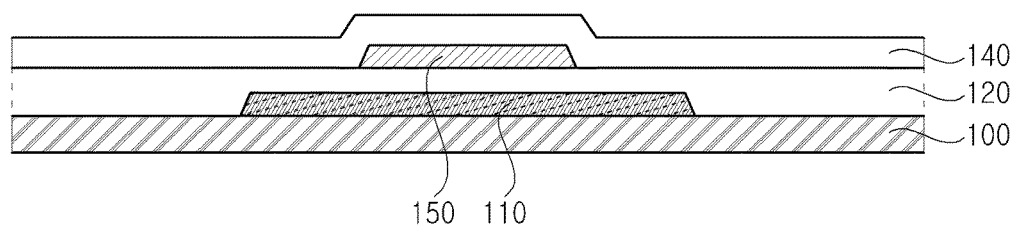

Next, as shown in FIG. 16B, the gate electrode 150 is patterned on the buffer layer 120, and the gate insulating film 140 is formed on the entire surface of the substrate 100 including the gate electrode 150. The gate electrode 150 may be patterned using a second mask process.

Figure 16C:
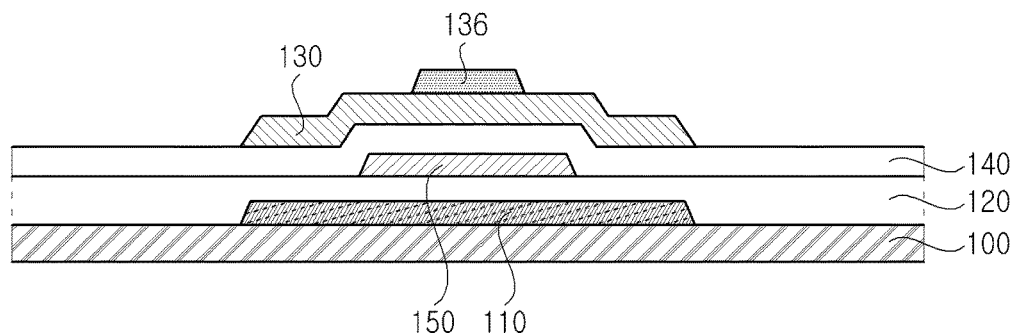

Next, as shown in FIG. 16C, the active layer 130 is patterned on the gate insulating film 140, and the mask layer 136 is patterned on the active layer 130. The active layer 130 may be patterned using a third mask process, and the mask layer 136 may be patterned using a fourth mask process.

After the mask layer 136 is patterned, a conducting process for one end area and the other end area of the active layer 130, which are not covered with the mask layer 136, are performed.

The conducting process may be performed by a process of performing plasma treatment on oxide semiconductor constituting the active layer 130. Namely, if plasma treatment is performed on the oxide semiconductor such as IGZO, properties of the oxide semiconductor are varied and then conducted.

Plasma treatment for the oxide semiconductor may be performed by a plasma etching process or an enhanced capacitively coupled plasma treatment process. Since the plasma etching process or the enhanced capacitively coupled plasma treatment process may be performed using the existing dry etching equipment, it is advantageous in that the cost for equipment development may be reduced.

Figure 16D:
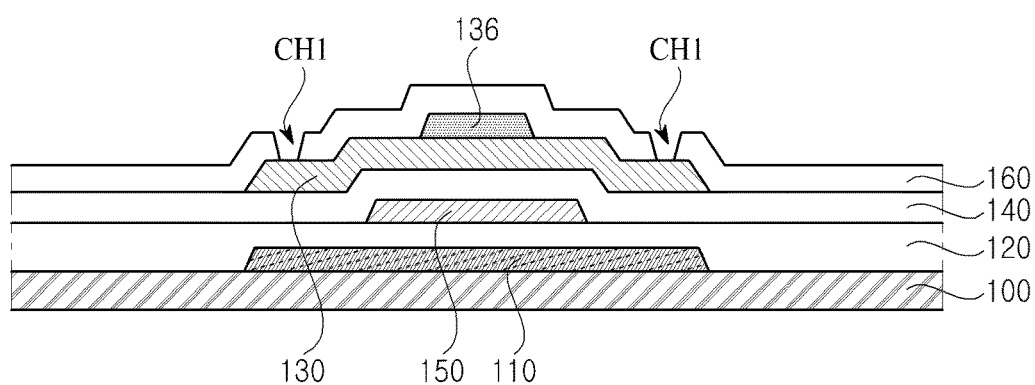

Next, as shown in FIG. 16D, the insulating interlayer 160 is patterned on the active layer 130 and the mask layer 136.

The insulating interlayer 160 may be patterned by a fifth mask process to have the first contact hole CH1 that exposes one end area and the other end area of the conducted active layer 130.

Figure 16E:
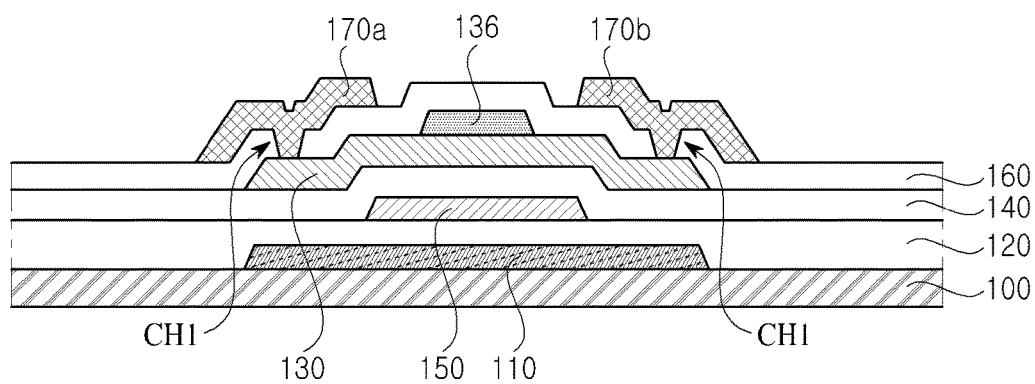

Next, as shown in FIG. 16E, the source electrode 170a and the drain electrode 170b are patterned on the insulating interlayer 160.

The source electrode 170a and the drain electrode 170b may be patterned by a sixth mask process so that the source electrode 170a is connected with one end area of the active layer 130 through the first contact hole CH1 and the drain electrode 170b is connected with the other end area of the active layer 130 through the first contact hole CH1.

Figure 16F:
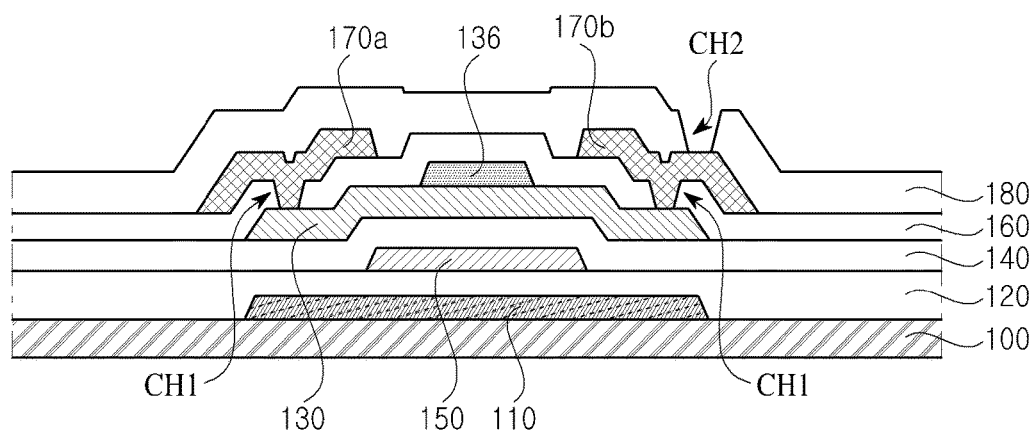

Next, as shown in FIG. 16F, the passivation film 180 is patterned on the source electrode 170a and the drain electrode 170b. The passivation film 180 may be patterned using a seventh mask process to have the second contact hole CH2 that exposes the drain electrode 170b.

Figure 16G:
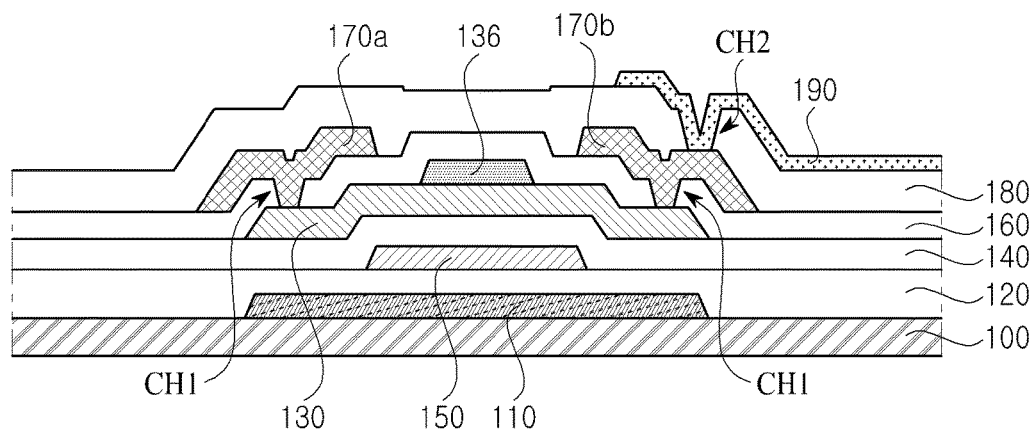

Next, as shown in FIG. 16G, the pixel electrode 190 is patterned on the passivation film 180. The pixel electrode 190 may be patterned using an eighth mask process to be connected with the drain electrode 170b through the second contact hole CH2.

FIGS. 17A to 17G are cross-sectional views illustrating process steps of a method of manufacturing a thin film transistor substrate according to still another embodiment of the present invention, and relate to process steps of the aforementioned thin film transistor substrate of FIG. 15.

Figure 17A:
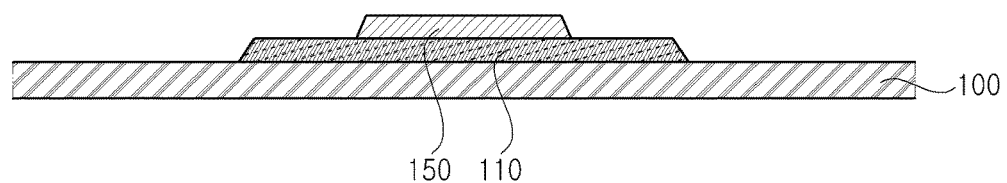
FIGS. 17A to 17G are cross-sectional views illustrating process steps of a method of manufacturing a thin film transistor substrate according to further still another embodiment of the present invention.

First, as shown in FIG. 17A, the light-shielding layer 110 and the gate electrode 150 are patterned on the substrate 100.

The light-shielding layer 110 and the gate electrode 150 may be patterned by a first mask process through an exposure process of one time using a halftone mask.

Figure 17B:
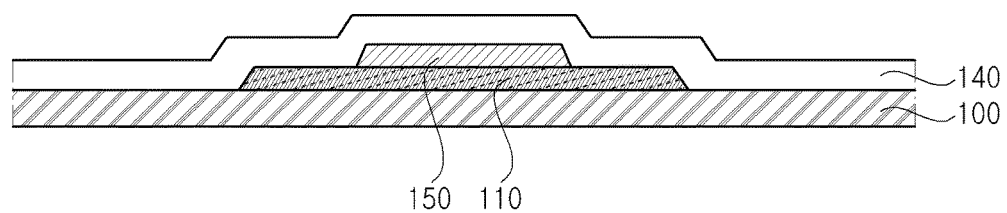

Next, as shown in FIG. 17B, the gate insulating film 140 is formed on the entire surface of the substrate 100 including the gate electrode 150.

Figure 17C:
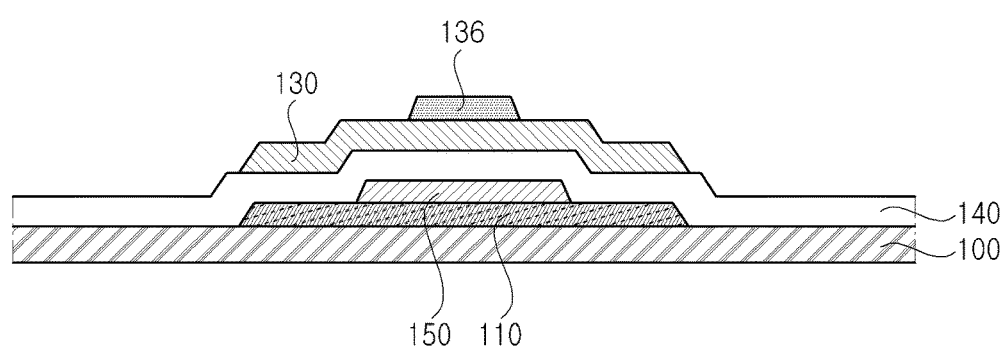

Next, as shown in FIG. 17C, the active layer 130 is patterned on the gate insulating film 140, and the mask layer 136 is patterned on the active layer 130. The active layer 130 may be patterned using a second mask process, and the mask layer 136 may be patterned using a third mask process.

After the mask layer 136 is patterned, a conducting process for one end area and the other end area of the active layer 130, which are not covered with the mask layer 136, are performed.

Figure 17D:
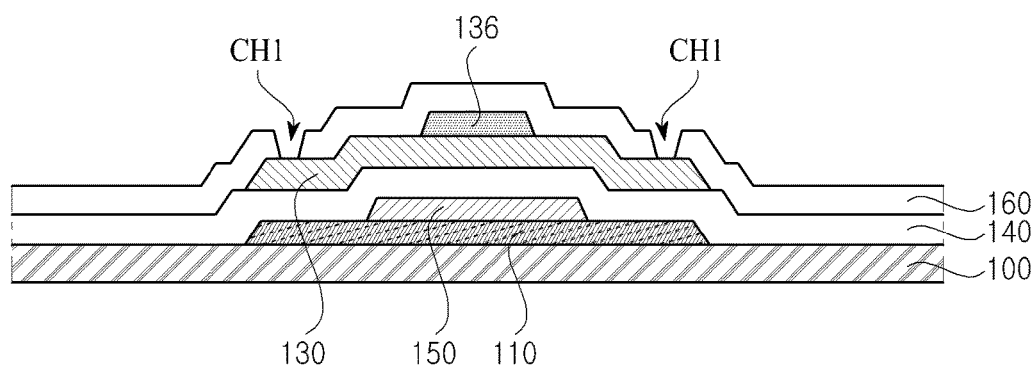

Next, as shown in FIG. 17D, the insulating interlayer 160 is patterned on the active layer 130 and the mask layer 136.

The insulating interlayer 160 may be patterned by a fourth mask process to have the first contact hole CH1 that exposes one end area and the other end area of the conducted active layer 130.

Figure 17E:
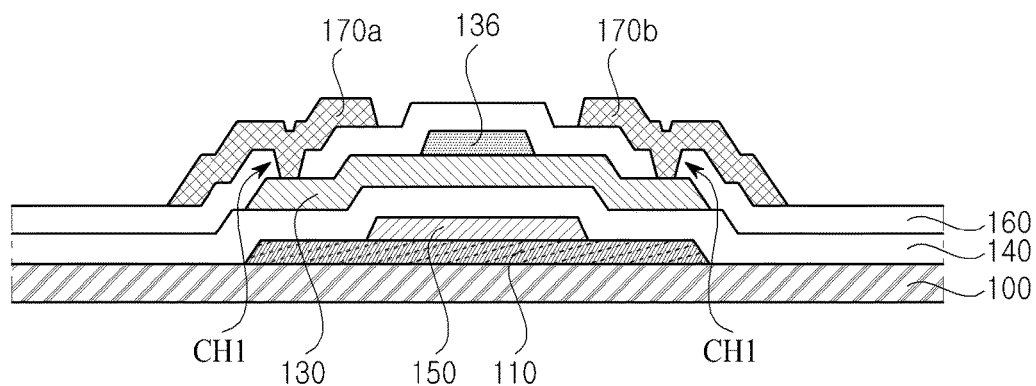

Next, as shown in FIG. 17E, the source electrode 170a and the drain electrode 170b are patterned on the insulating interlayer 160.

The source electrode 170a and the drain electrode 170b may be patterned by a fifth mask process so that the source electrode 170a is connected with one end area of the active layer 130 through the first contact hole CH1 and the drain electrode 170b is connected with the other end area of the active layer 130 through the first contact hole CH1.

Figure 17F:
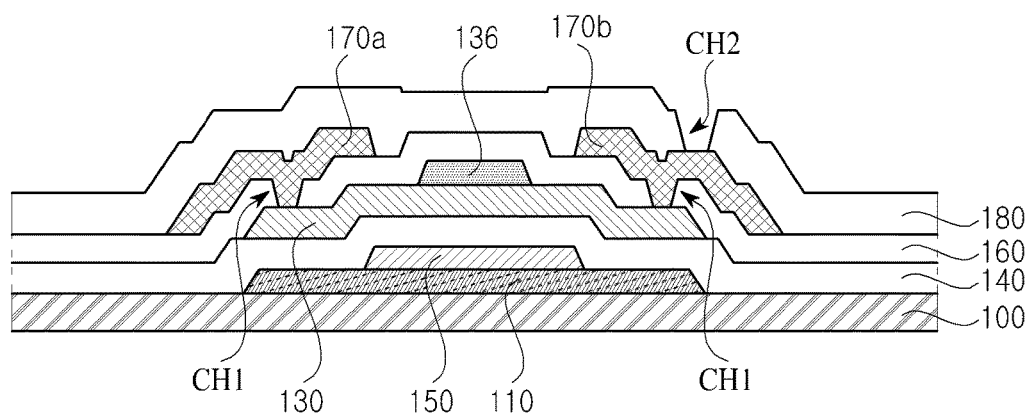

Next, as shown in FIG. 17F, the passivation film 180 is patterned on the source electrode 170a and the drain electrode 170b. The passivation film 180 may be patterned using a sixth mask process to have the second contact hole CH2 that exposes the drain electrode 170b.

Figure 17G:
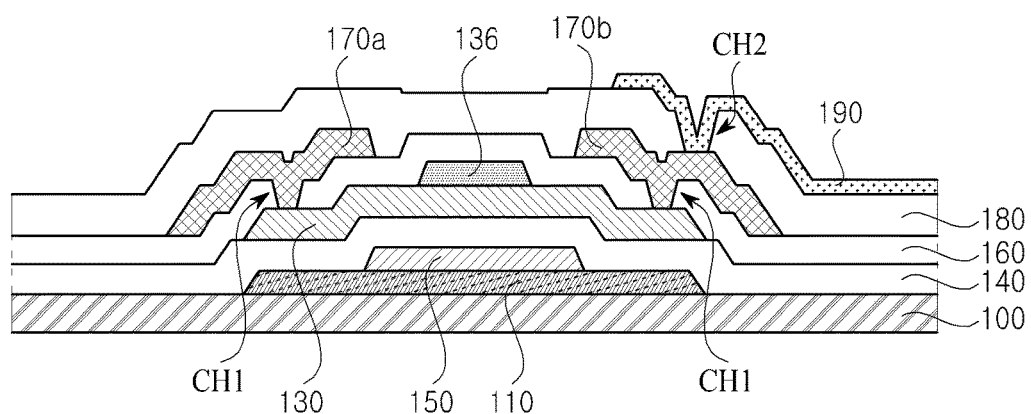

Next, as shown in FIG. 17G, the pixel electrode 190 is patterned on the passivation film 180. The pixel electrode 190 may be patterned using a seventh mask process to be connected with the drain electrode 170b through the second contact hole CH2.

Figure 18:
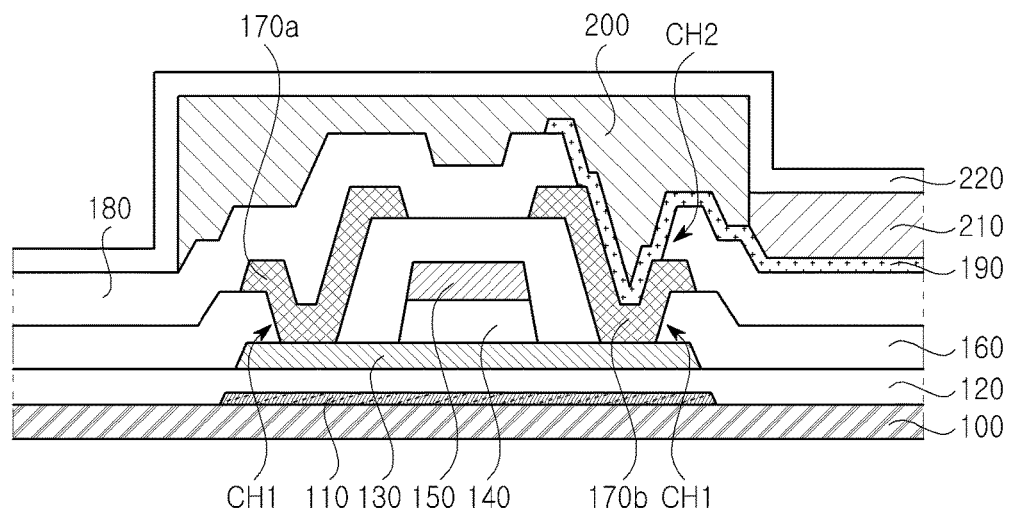
FIG. 18 is a cross-sectional view illustrating an organic light-emitting device according to one embodiment of the present invention.

FIG. 18 is a cross-sectional view illustrating an organic light-emitting device according to one embodiment of the present invention, and relates to the organic light-emitting device to which the thin film transistor substrate of FIG. 2 is applied.

As shown in FIG. 18, the organic light-emitting device according to one embodiment of the present invention includes the aforementioned thin film transistor substrate of FIG. 2, and further includes a bank layer 200, a light-emitting part 210, and an upper electrode 220 on the thin film transistor substrate.

The bank layer 200 is formed on the passivation film 180. In more detail, the bank layer 200 is formed to be overlapped with the source electrode 170a and the drain electrode 170b, especially in an area except for a pixel area. In other words, the pixel area that displays picture image is surrounded by the bank layer 200.

The bank layer 200 may be made of, but not limited to, an organic insulating material such as polyimide, photo acryl, or BCB.

The light-emitting part 210 is formed on the pixel electrode 190. Although not shown, the light-emitting part 210 may be formed in a stacked structure in which a hole injection layer, a hole transport layer, an organic light-emitting layer, an electron transport layer, and an electron injection layer are sequentially stacked. However, one or more layers of the hole injection layer, the hole transport layer, an electron transport layer, and the electron injection layer may be omitted. In addition to combination of the aforementioned layers, various modifications known in the art may be made in the light-emitting part 210.

The upper electrode 220 is formed on the light-emitting part 210. The upper electrode 220 may serve as a common electrode. In this case, the upper electrode 220 may be formed on the bank layer 200 in addition to the light-emitting part 210.

The upper electrode 220 may be made of, but not limited to, metal such as Ag.

The aforementioned organic light-emitting device of FIG. 18 is manufactured in such a manner that the thin film transistor substrate is manufactured by the process steps of FIGS. 4A to 4G, the bank layer 200 is patterned on the passivation film 180 above the source electrode 170a and the drain electrode 170b, the light-emitting part 210 is patterned on the pixel electrode 190, and the upper electrode 220 is formed on the light-emitting part 210.

Although not shown, the organic light-emitting device to which the thin film transistor substrate according to the aforementioned embodiments is applied and the method of manufacturing the organic light-emitting device, to which the method of manufacturing the thin film transistor substrate according to the aforementioned embodiments is applied, are within the scope of the present invention.

Figure 19:
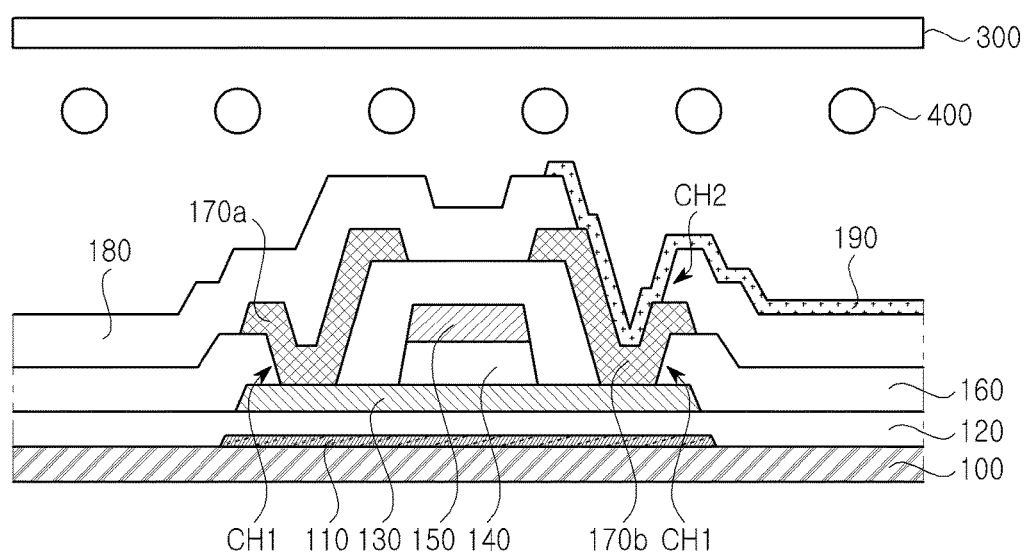
FIG. 19 is a cross-sectional view illustrating a liquid crystal display device according to one embodiment of the present invention.

FIG. 19 is a cross-sectional view illustrating a liquid crystal display device according to one embodiment of the present invention, and relates to a liquid crystal display device to which the thin film transistor substrate of FIG. 2 is applied.

As shown in FIG. 19, the liquid crystal display device according to one embodiment of the present invention includes the aforementioned thin film transistor substrate of FIG. 2, an opposite substrate 300 opposite to the thin film transistor substrate, and a liquid crystal layer 400 formed between the above substrates.

Although not shown, a common electrode for forming electric field together with the pixel electrode 190 for driving a liquid crystal may additionally be formed on the thin film transistor substrate.

Although not shown, the opposite substrate 300 may include a black matrix and a color filter layer.

The black matrix is formed in a matrix arrangement to shield the light from leaking to the area except for the pixel area, and the color filter layer is formed between the matrix structures of the black matrix.

The liquid crystal display device according to the present invention may be applied to a liquid crystal display device of various modes known in the art, such as a twisted nematic (TN) mode, a vertical alignment (VA) mode, and an in-plane switching (IPS) mode.

The aforementioned liquid crystal display device of FIG. 19 is manufactured in such a manner that the thin film transistor substrate is manufactured by the process steps of FIGS. 4A to 4G, the opposite substrate 300 is manufactured, and the substrates are bonded to each other while having the liquid crystal layer 400 between the substrates.

The process of bonding the substrates may be performed using a vacuum injection method or liquid crystal dispensing method.

Although not shown, the liquid crystal display device to which the thin film transistor substrate according to the aforementioned embodiments is applied and the method of manufacturing the liquid crystal display device, to which the method of manufacturing the thin film transistor substrate according to the aforementioned embodiments is applied, are within the scope of the present invention.

According to the present invention as described above, the following advantages may be obtained.

Since the light-shielding layer according to the present invention is formed on the substrate, it may shield the light from entering the active layer, whereby reliability of the active layer may be maintained without being reduced. Particularly, since the light-shielding layer according to the present invention is made of a semiconductor material having poor electric conductivity or a black resin material, parasitic capacitance does not occur between the light-shielding layer and the other electrodes, whereby a double gate structure of which design and process steps are complicated is not required.

Also, according to the present invention, since the light-shielding layer is formed on the substrate, the size of the gate electrode may be reduced, whereby restriction in designing the thin film transistor may be reduced, and parasitic capacitance between the gate electrode and the source electrode and between the gate electrode and the drain electrode may be reduced to enable high speed driving of the device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate, comprising:
a substrate;
a light-shielding layer disposed on and in direct contact with the substrate;
a gate electrode disposed on and in direct contact with the light-shielding layer;
a gate insulating film disposed on and in direct contact with the gate electrode;
an active layer disposed on and in direct contact with the gate insulating film, the active layer having depressed end portions such that an upper surface of the depressed end portion is at least at a same level or higher as an upper surface of the gate insulating film over the gate electrode, the active layer having an area greater than that of the gate electrode, the gate electrode controlling electron transfer within the active layer;
a channel protective member directly on a channel area of the active layer, the channel protective member having an area smaller than that of the active area and of the gate electrode;
a source electrode connected with and disposed over one end area of the active layer, and over the gate insulating film;
a drain electrode connected with and disposed over the other end area of the active layer, and over the gate insulating film; and
an insulating interlayer disposed over the channel protective member and under the source electrode and the drain electrode to directly contact upper surfaces of the active layer and the gate insulating layer, the source electrode and the drain electrode penetrating the insulating interlayer to directly contact the active layer,
wherein a lateral surface of the source electrode that is disposed on and in direct contact with an upper surface of the insulating interlayer extends laterally beyond a first end of the active layer,
wherein a lateral surface of the drain electrode that is disposed on and in direct contact with the upper surface of the insulating interlayer extends laterally beyond a second end of the active layer,
wherein the light-shielding layer is configured to shield light from entering the active layer,
wherein the light-shielding layer has an area equal to or greater than that of the active layer, and
wherein a surface of an end of at least one of the source electrode and the drain electrode laterally faces a side surface of the first end or the second end of the active layer.

2. The thin film transistor substrate of claim 1, wherein the light-shielding layer is made of a semiconductor material or a black resin material.

3. The thin film transistor substrate of claim 2, wherein the semiconductor material is made of amorphous silicon.

4. The thin film transistor substrate of claim 3, wherein the amorphous silicon is formed at a thickness of 1000 Å to 3000 Å.

5. The thin film transistor of claim 1, wherein the insulating interlayer is disposed on and in direct contact with entire upper and side surfaces of the channel protective member.

6. The thin film transistor of claim 1, further comprising:
a passivation layer on the source and drain electrode; and
a pixel electrode connected to the drain electrode through the passivation layer,
wherein an upper surface of the insulating interlayer has a stepped shape corresponding to upper surfaces of the gate insulating layer, the active layer, and the channel protective member, and
wherein the passivation layer and the pixel electrode each have stepped shapes corresponding to the step shape of the upper surface of the insulating interlayer.

7. The thin film transistor of claim 1, wherein the source electrode and the drain electrode are both formed of a same material at a same level in direct contact with an upper surface of the insulating interlayer.

8. The thin film transistor of claim 1, wherein the lateral surface of the source electrode is lower than an upper surface at the first end of the active layer, and wherein the lateral surface of the drain electrode is lower than an upper surface at the second end of the active layer.

9. A method of manufacturing a thin film transistor substrate, the method comprising:
forming a substrate;
forming a light-shielding layer on and in direct contact with the substrate;
forming a gate electrode on and in direct contact with the light-shielding layer;
forming a gate insulating film on and in direct contact with the gate electrode;
forming an active layer on and in direct contact with the gate insulating film, the active layer having depressed end portions such that an upper surface of the depressed end portion is at least at a same level or higher as an upper surface of the gate insulating film over the gate electrode, the active layer having an area greater than that of the gate electrode, the gate electrode controlling electron transfer within the active layer;
forming a channel protective member directly on a channel area of the active layer, the channel protective member having an area smaller than that of the active area and of the gate electrode;
forming a source electrode connected with and over one end area of the active layer, and over the gate insulating film;
forming a drain electrode connected with and over the other end area of the active layer, and over the gate insulating film; and
forming an insulating interlayer over the channel protective member and under the source electrode and the drain electrode to directly contact upper surfaces of the active layer and the gate insulating layer, the source electrode and the drain electrode penetrating the insulating interlayer to directly contact the active layer,
wherein a lateral surface of the source electrode that is disposed on and in direct contact with an upper surface of the insulating interlayer extends laterally beyond a first end of the active layer,
wherein a lateral surface of the drain electrode that is disposed on and in direct contact with the upper surface of the insulating interlayer extends laterally beyond a second end of the active layer,
wherein the light-shielding layer is configured to shield light from entering the active layer,
wherein the light-shielding layer has an area equal to or greater than that of the active layer, and
wherein a surface of an end of at least one of the source electrode and the drain electrode laterally faces a side surface of the first end or the second end of the active layer.

10. The method of claim 9, wherein the light-shielding layer is made of a semiconductor material or a black resin material.

11. The method of claim 9, wherein the light-shielding layer and the gate electrode are patterned together by one mask process.

12. The method of claim 9, wherein the insulating interlayer is disposed on and in direct contact with entire upper and side surfaces of the channel protective member.

13. The method of claim 9, further comprising:
a passivation layer on the source and drain electrode; and
a pixel electrode connected to the drain electrode through the passivation layer,
wherein an upper surface of the insulating interlayer has a stepped shape corresponding to upper surfaces of the gate insulating layer, the active layer, and the channel protective member, and
wherein the passivation layer and the pixel electrode each have stepped shapes corresponding to the step shape of the upper surface of the insulating interlayer.

14. The method of claim 9, wherein the source electrode and the drain electrode are simultaneously formed of a same material at a same level in direct contact with an upper surface of the insulating interlayer.

15. A display device comprising a thin film transistor substrate, the thin film transistor substrate comprising:
a substrate;
a light-shielding layer disposed on and in direct contact with the substrate;
a gate electrode disposed on and in direct contact with the light-shielding layer;
a gate insulating film disposed on and in direct contact with the gate electrode;
an active layer disposed on and in direct contact with the gate insulating film, the active layer having depressed end portions such that an upper surface of the depressed end portion is at least at a same level or higher as an upper surface of the gate insulating film over the gate electrode, the active layer having an area greater than that of the gate electrode, the gate electrode controlling electron transfer within the active layer;
a channel protective member directly on a channel area of the active layer, the channel protective member having an area smaller than that of the active area and of the gate electrode;
a source electrode connected with and disposed over one end area of the active layer, and in direct contact with over the gate insulating film;
a drain electrode connected with and disposed over the other end area of the active layer, and over the gate insulating film; and
an insulating interlayer disposed over the channel protective member and under the source electrode and the drain electrode to directly contact upper surfaces of the active layer and the gate insulating layer, the source electrode and the drain electrode penetrating the insulating interlayer to directly contact the active layer,
wherein a lateral surface of the source electrode that is disposed on and in direct contact with an upper surface of the insulating interlayer extends laterally beyond a first end of the active layer,
wherein a lateral surface of the drain electrode that is disposed on and in direct contact with the upper surface of the insulating interlayer extends laterally beyond a second end of the active layer,
wherein the light-shielding layer is configured to shield light from entering the active layer,
wherein the light-shielding layer has an area equal to or greater than that of the active layer, and
wherein a surface of an end of at least one of the source electrode and the drain electrode faces a laterally side surface of the first end or the second end of the active layer.

16. The display device of claim 15, wherein the insulating interlayer is disposed on and in direct contact with entire upper and side surfaces of the channel protective member.

17. The display device of claim 15, further comprising:
a passivation layer on the source and drain electrode; and
a pixel electrode connected to the drain electrode through the passivation layer,
wherein an upper surface of the insulating interlayer has a stepped shape corresponding to upper surfaces of the gate insulating layer, the active layer, and the channel protective member, and
wherein the passivation layer and the pixel electrode each have stepped shapes corresponding to the step shape of the upper surface of the insulating interlayer.

18. The display device of claim 15, wherein the source electrode and the drain electrode are both formed of a same material at a same level in direct contact with an upper surface of the insulating interlayer.

19. A method of manufacturing a display device, which comprises a method of manufacturing a thin film transistor substrate, the method of manufacturing a thin film transistor substrate comprising:
forming a substrate;
forming a light-shielding layer on and in direct contact with the substrate;
forming a gate electrode on and in direct contact with the light-shielding layer;
forming a gate insulating film on and in direct contact with the gate electrode;
forming an active layer on and in direct contact with the gate insulating film, the active layer having depressed end portions such that an upper surface of the depressed end portion is at least at a same level or higher as an upper surface of the gate insulating film over the gate electrode, the active layer having an area greater than that of the gate electrode, the gate electrode controlling electron transfer within the active layer;
forming a channel protective member directly on a channel area of the active layer, the channel protective member having an area smaller than that of the active area and of the gate electrode;

forming a source electrode connected with and over one end area of the active layer, and over the gate insulating film;

forming a drain electrode connected with and over the other end area of the active layer, and over the gate insulating film; and forming an insulating interlayer over the channel protective member and under the source electrode and the drain electrode to directly contact upper surfaces of the active layer and the gate insulating layer, the source electrode and the drain electrode penetrating the insulating interlayer to directly contact the active layer, wherein a lateral surface of the source electrode that is disposed on and in direct contact with an upper surface of the insulating interlayer extends laterally beyond a first end of the active layer, wherein a lateral surface of the drain electrode that is disposed on and in direct contact with the upper surface of the insulating interlayer extends laterally beyond a second end of the active layer, wherein the light-shielding layer is configured to shield light from entering the active layer, wherein the light-shielding layer has an area equal to or greater than that of the active layer, and wherein a surface of an end of at least one of the source electrode and the drain electrode laterally faces a side surface of the first end or the second end of the active layer.

20. The method of claim 19, wherein the insulating interlayer is disposed on and in direct contact with entire upper and side surfaces of the channel protective member.

21. The method of claim 19, wherein the source electrode and the drain electrode are simultaneously formed of a same material at a same level in direct contact with an upper surface of the insulating interlayer.

* * * * *